United States Patent
Tsuji

(10) Patent No.: US 9,148,090 B2
(45) Date of Patent: Sep. 29, 2015

(54) POWER SUPPLY DEVICE FOR HIGH FREQUENCY POWER AMPLIFICATION CIRCUIT AND HIGH FREQUENCY POWER AMPLIFICATION DEVICE

(71) Applicant: Murata Manufacturing Co., Ltd., Nagaokakyo-shi, Kyoto-fu (JP)

(72) Inventor: Hitoshi Tsuji, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 57 days.

(21) Appl. No.: 14/132,047

(22) Filed: Dec. 18, 2013

(65) Prior Publication Data

US 2015/0002232 A1 Jan. 1, 2015

Related U.S. Application Data

(63) Continuation of application No. PCT/JP2012/063435, filed on May 25, 2012.

(30) Foreign Application Priority Data

Jun. 22, 2011 (JP) ................. 2011-138852

(51) Int. Cl.
*H03G 3/20* (2006.01)
*H03F 1/02* (2006.01)
*H03F 3/189* (2006.01)
*H03F 3/24* (2006.01)
*H03F 3/21* (2006.01)
*H04B 1/04* (2006.01)
*H02M 3/158* (2006.01)

(52) U.S. Cl.
CPC ........... *H03F 1/0222* (2013.01); *H02M 3/1584* (2013.01); *H03F 1/025* (2013.01); *H03F 3/189* (2013.01); *H03F 3/21* (2013.01); *H03F 3/245* (2013.01); *H04B 1/0475* (2013.01);

(Continued)

(58) Field of Classification Search
CPC ..................................... H03G 3/20; H03F 1/30
USPC ........................... 330/129, 136, 285, 296, 297
See application file for complete search history.

(56) References Cited

U.S. PATENT DOCUMENTS 7,058,373 B2 * 6/2006 Grigore ....................... 455/127.1
8,093,946 B2 * 1/2012 Wimpenny et al. ........... 330/136

(Continued)

FOREIGN PATENT DOCUMENTS

JP 2006-514472 A 4/2006
JP 2010-016794 A 1/2010

(Continued)

OTHER PUBLICATIONS

Official Communication issued in International Patent Application No. PCT/JP2012/063435, mailed on Aug. 21, 2012.

*Primary Examiner* — Henry Choe
(74) *Attorney, Agent, or Firm* — Keating & Bennett, LLP

(57) ABSTRACT

In a power supply device, bidirectional converters that are each capable of supplying or regenerating an electric charge are provided between an input section for an input voltage and an output section for an output voltage. An amplitude change monitor circuit detects an envelope of an RF input signal. A converter switching circuit controls supply and regeneration of electric charges by the bidirectional converters so that the output voltage follows an amplitude change of the input signal. An output capacitor capacitance estimation unit estimates the capacitance of an output capacitor from its voltage and current. A delay time detection circuit grasps a delay time of a power supply device for a high frequency power amplification circuit and makes an adjustment through a delay adjustment circuit.

21 Claims, 31 Drawing Sheets

(52) U.S. Cl.
CPC ........ *H02M3/1582* (2013.01); *H03F 2200/102* (2013.01); *H03F 2200/451* (2013.01); *H03F 2200/504* (2013.01); *H03F 2200/507* (2013.01); *H03F 2200/511* (2013.01); *H03F 2200/516* (2013.01); *H04B 2001/045* (2013.01)

(56) References Cited

U.S. PATENT DOCUMENTS

| | | | |
|---|---|---|---|
| 8,354,883 B2 * | 1/2013 | Koo et al. | 330/136 |
| 8,723,490 B2 * | 5/2014 | Moussaoui et al. | 323/259 |
| 2006/0028271 A1 * | 2/2006 | Wilson | 330/199 |
| 2011/0031953 A1 | 2/2011 | Kanbe et al. | |
| 2011/0090008 A1 | 4/2011 | Kunihiro | |
| 2011/0241775 A1 | 10/2011 | Kunihiro et al. | |

FOREIGN PATENT DOCUMENTS

| | | |
|---|---|---|
| JP | 2010-206883 A | 9/2010 |
| WO | 2009/099056 A1 | 8/2009 |
| WO | 2010/001806 A1 | 1/2010 |
| WO | 2010/073941 A1 | 7/2010 |

* cited by examiner ed in FIG. 1 includes an envelope detection circuit (ENVELOPE DETECTOR) 54, a supply voltage selection circuit (SUPPLY VOLTAGE SELECTION) 56, a power supply voltage adjustment circuit (SUPPLY VOLTAGE ADJUSTMENT) 58, and a high frequency amplification circuit (RF AMPLIFIER) 52. The envelope detection circuit 54 detects an envelope of a high frequency signal (REIN), and the supply voltage selection circuit 56 selects a voltage source (V1 to V4) so as to follow the envelope of the high frequency signal (REIN). The power supply voltage adjustment circuit 58 adjusts the waveform of the selected voltage and supplies the result to the high frequency amplification circuit as a power supply voltage. Thus, the high frequency amplification circuit 52 amplifies the high frequency signal (REIN) and outputs a high frequency signal (RFOUT).

POWER SUPPLY DEVICE FOR HIGH FREQUENCY POWER AMPLIFICATION CIRCUIT AND HIGH FREQUENCY POWER AMPLIFICATION DEVICE

BACKGROUND OF THE INVENTION

1. Field of the Invention

The present invention relates to power supply devices for high frequency power amplification circuits. In particular, the present invention relates to a power supply device that improves power efficiency of a high frequency power amplification circuit and to a high frequency power amplification device that includes such a power supply device.

2. Description of the Related Art

Japanese Unexamined Patent Application Publication No. 2006-514472 describes a configuration in which, in order to enhance the efficiency of a high frequency amplification circuit, a power supply voltage of the high frequency amplification circuit is caused to follow an amplitude change (envelope) of a high frequency signal to be amplified. The frequency of the amplitude change of the high frequency signal here is not a carrier wave frequency (e.g., 1 GHz to 2 GHz in cellular phones) but is the frequency (approximately 10 MHz to 100 MHz) of the amplitude change of the carrier wave. An example of an audio amplification circuit is a class-D amplification circuit (digital amplifier), but in a power supply device for a high frequency power amplification circuit, a frequency band to be handled is a high frequency band, and thus extremely high speed switching is required.

FIG. 1 is a block diagram of a high frequency power amplification circuit 50 described in Japanese Unexamined Patent Application Publication No. 2006-514472. This high frequency power amplification circuit (RF AMPLIFICATION STAGE) 50 illustrated in FIG. 1 includes an envelope detection circuit (ENVELOPE DETECTOR) 54, a supply voltage selection circuit (SUPPLY VOLTAGE SELECTION) 56, a power supply voltage adjustment circuit (SUPPLY VOLTAGE ADJUSTMENT) 58, and a high frequency amplification circuit (RF AMPLIFIER) 52. The envelope detection circuit 54 detects an envelope of a high frequency signal (REIN), and the supply voltage selection circuit 56 selects a voltage source (V1 to V4) so as to follow the envelope of the high frequency signal (REIN). The power supply voltage adjustment circuit 58 adjusts the waveform of the selected voltage and supplies the result to the high frequency amplification circuit as a power supply voltage. Thus, the high frequency amplification circuit 52 amplifies the high frequency signal (REIN) and outputs a high frequency signal (RFOUT).

The high frequency power amplification device of Japanese Unexamined Patent Application Publication No. 2006-514472, however, employs a system in which a plurality of voltage sources are prepared and a voltage source is selected so as to follow the envelope of the high frequency signal. Thus, a complex circuit and extremely complex control are required to repair a voltage difference (waveform step) occurring when switching among the plurality of voltage sources. If this repair of the waveform step is incomplete, distortion in the waveform increases, and an adjacent channel leakage power ratio (ACPR) in a communication system increases. Thus, frequencies outside a stipulated range are negatively affected, leading to a problem that the high frequency power amplification device cannot be applied to a product having strict frequency band allocation.

SUMMARY OF THE INVENTION

Preferred embodiments of the present invention provide a power supply device for a high frequency power amplification circuit and a high frequency power amplification device that enable a power supply voltage of a high frequency amplification circuit to follow an envelope of a high frequency signal with a relatively simple configuration.

A power supply device for a high frequency power amplification circuit according to a preferred embodiment of the present invention is configured to vary a power supply voltage supplied to the high frequency power amplification circuit that amplifies a high frequency signal in accordance with an amplitude change of the high frequency signal.

The power supply device includes one or a plurality of bidirectional converters provided between an input section for an input voltage and an output section for an output voltage, and the bidirectional converter is arranged to supply or regenerate an electric charge.

The power supply device further includes an amplitude change monitor circuit configured to detect the amplitude change of the high frequency signal and to control the bidirectional converter supplying or regenerating an electric charge so that the output voltage follows the amplitude change of the high frequency signal.

Furthermore, a high frequency power amplification device according to a preferred embodiment of the present invention includes a high frequency power amplification circuit that amplifies a high frequency signal, and a power supply device for the high frequency power amplification circuit which is configured to vary a power supply voltage supplied to the high frequency power amplification circuit in accordance with an amplitude change of the high frequency signal.

The high frequency power amplification device includes one or a plurality of bidirectional converters provided between an input section for an input voltage and an output section for an output voltage, and the bidirectional converter is capable of supplying or regenerating an electric charge.

The high frequency power amplification device further includes an amplitude change monitor circuit configured to detect an amplitude change of the high frequency signal and to control the bidirectional converter supplying or regenerating an electric charge so that the output voltage follows the amplitude change of the high frequency signal.

According to various preferred embodiments of the present invention, a bidirectional converter is capable of supplying and regenerating an electric charges, and thus carrying out non-linear control (pulse duration control, frequency control, combined control of a sleep time and a burst time) of ON/OFF times of an internal switching device in the bidirectional converter makes it possible to secure a large dynamic range, enabling high speed control. Consequently, irrespective of a range, namely from a low frequency to a high frequency, the amplitude and the phase of an output voltage is adjusted to a high frequency input signal with high precision, and the output voltage is made to follow the envelope as well.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
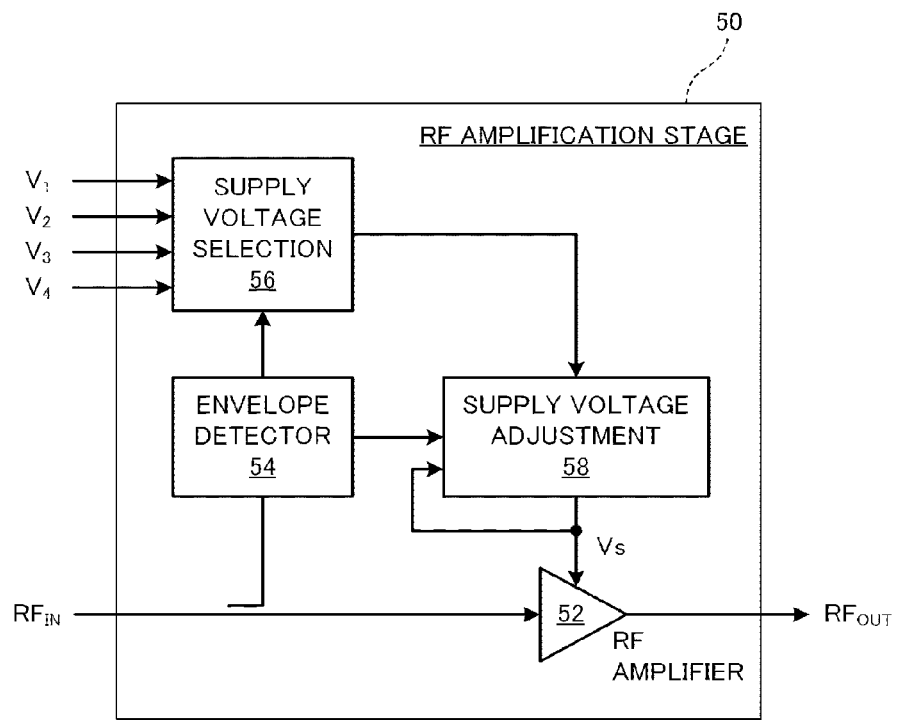
FIG. 1 is a block diagram of a high frequency power amplification circuit 50 described in Japanese Unexamined Patent Application Publication No. 2006-514472.
Figure 2:
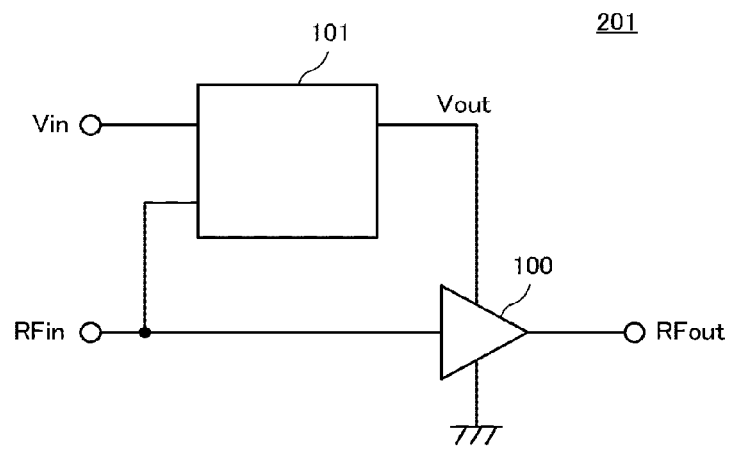
FIG. 2 is a diagram illustrating the relationship among a power supply device 101 for a high frequency power amplification circuit, a high frequency power amplification device 201, and a high frequency power amplification circuit 100 according to a first preferred embodiment of the present invention.

FIG. 2 is a diagram illustrating the relationship among a power supply device 101 for a high frequency power amplification circuit, a high frequency power amplification device 201, and a high frequency power amplification circuit 100 according to a first preferred embodiment of the present invention.

The high frequency power amplification circuit 100 receives a high frequency signal RFin as an input, amplifies the power thereof, and outputs a high frequency power signal RFout. The power supply device 101 for a high frequency power amplification circuit receives an input power supply voltage Vin as an input and detects an amplitude change (envelope) of the high frequency signal RFin. The power supply device 101 then varies an output voltage Vout so as to follow the amplitude change. The high frequency power amplification circuit 100 operates with the output voltage Vout of the power supply device 101 for a high frequency power amplification circuit serving as a power supply voltage thereof.

Figure 3A:
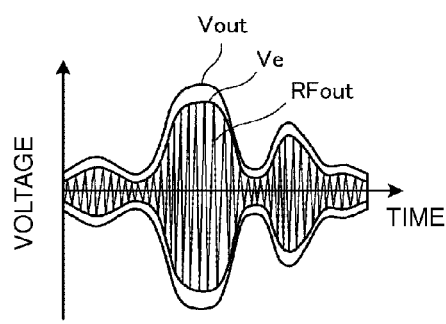
FIGS. 3A and 3B are diagrams illustrating the relationship among a power supply voltage Vout of the high frequency power amplification circuit 100, a high frequency power signal RFout, and an envelope Ve of the high frequency power signal RFout.
Figure 3B:
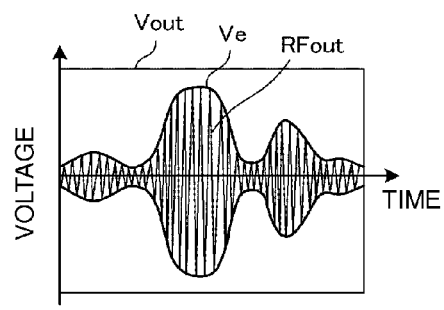

FIGS. 3A and 3B are diagrams illustrating the relationship among the power supply voltage Vout of the high frequency power amplification circuit 100, the high frequency power signal RFout, and an envelope Ve of the high frequency power signal RFout. FIG. 3A illustrates waveforms obtained when the power supply device 101 for a high frequency power amplification circuit is put into operation, and FIG. 3B illustrates waveforms obtained when the power supply voltage of the high frequency power amplification circuit 100 is kept constant. Here, for convenience when illustrating the envelope of the high frequency signal, the power supply voltage is also illustrated as being symmetric in positive and negative directions. Roughly, the difference between Vout and Ve can be a loss. According to various preferred embodiments of the present invention, this loss is significantly reduced.

Figure 4:
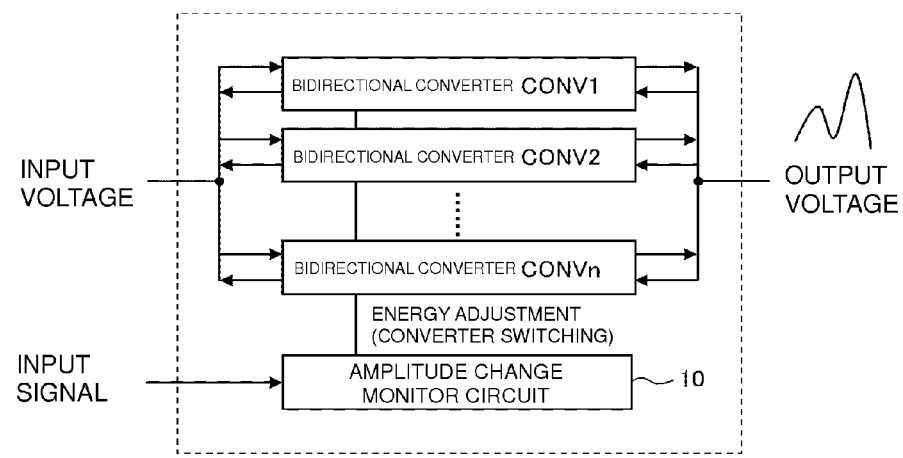
FIG. 4 is a block diagram illustrating a configuration of the power supply device 101 for a high frequency power amplification circuit of the first preferred embodiment of the present invention.

FIG. 4 is a block diagram illustrating the configuration of the power supply device 101 for a high frequency power amplification circuit of the first preferred embodiment. A plurality of bidirectional converters CONV1, CONV2, ..., CONVn are provided between an input section for an input voltage and an output section for an output voltage. Each of these bidirectional converters is a converter that is capable of supplying and regenerating an electric charge. Right and left arrows at the input and output sections indicate the energy transfer directions. In FIG. 4, the "input signal" is an amplitude change signal (envelope signal (10 to 100 MHz)) of a high frequency signal (1 to 2 GHz). An amplitude change monitor circuit 10 controls the supply and regeneration of electric charges in the bidirectional converters CONV1, CONV2, ..., CONVn so that the output voltage follows the amplitude change signal.

Figure 5:
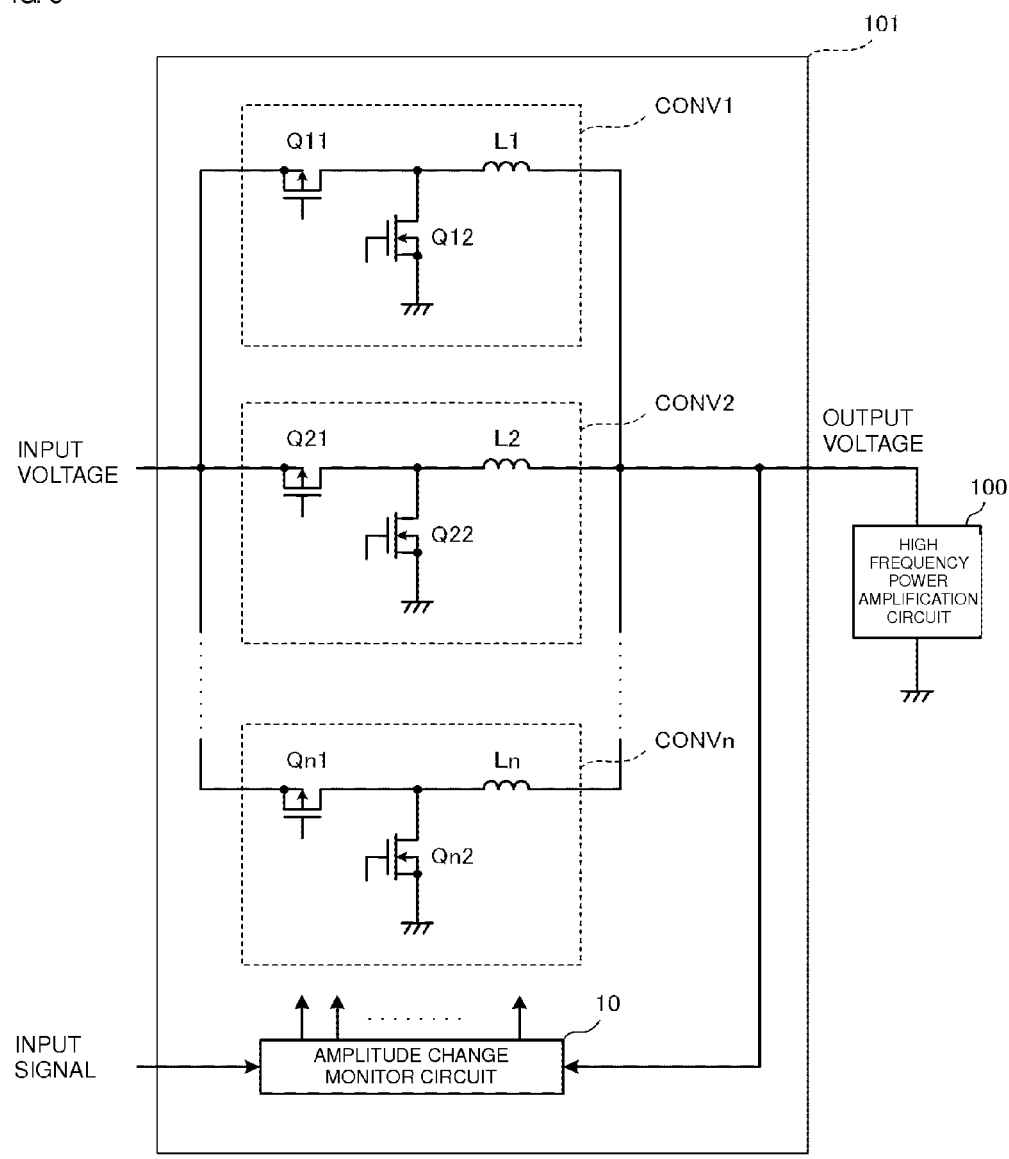
FIG. 5 is a diagram illustrating a detailed configuration of the power supply device 101 for a high frequency power amplification circuit and bidirectional converters included in the power supply device 101.

FIG. 5 is a diagram illustrating detailed configurations of the power supply device 101 for a high frequency power amplification circuit and of the bidirectional converters included in the power supply device 101. The bidirectional converter CONV1 includes a rectifying device (high side device) Q11, a commutation device (low side device) Q12, and a choke coil L1. The bidirectional converter CONV2 includes a rectifying device Q21, a commutation device Q22, and a choke coil L2. In a similar manner, the bidirectional converter CONVn includes a rectifying device Qn1, a commutation device Qn2, and a choke coil Ln. In addition, each of the bidirectional converters includes a switching control circuit that controls the rectifying device and the commutation device.

The amplitude change monitor circuit 10 provides a control signal to the switching control circuit of each bidirectional converter for energy adjustment. For example, the amplitude change monitor circuit 10 switches among the plurality of bidirectional converters so as to set which bidirectional converter is to be driven.

Figure 6:
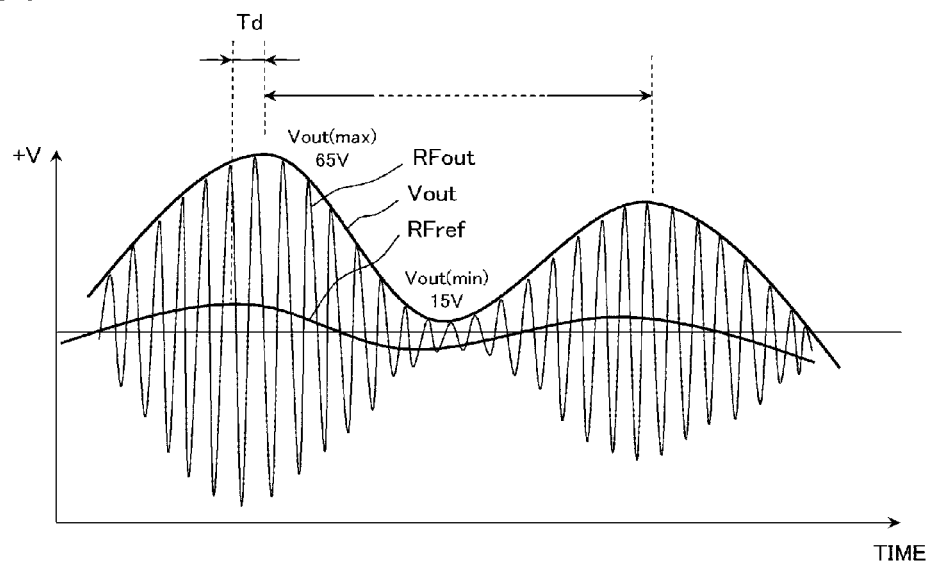
FIG. 6 is a diagram illustrating the relationship between an amplitude change RFref (envelope) of a high frequency signal and an envelope following output voltage Vout.

FIG. 6 is a diagram illustrating the relationship between an amplitude change RFref (envelope) of the high frequency signal and the envelope following output voltage Vout. As each bidirectional converter supplies or regenerates electric charges, the envelope following output voltage Vout follows the envelope of the input signal RFref. In this example, a power supply voltage of a maximum of 65 V and a minimum of 15 V is applied to the high frequency power amplification circuit 100 illustrated in FIG. 5. FIG. 6 illustrates an ideal state in which the difference between Vout illustrated in FIG. 3 and the envelope of the high frequency power signal (see Ve in FIG. 3) becomes zero.

Due to reasons, for example, the electric charge supply/regeneration operation in each bidirectional converter and a delay in a response of the amplitude change monitor circuit, the envelope following output voltage Vout is delayed by a delay time Td relative to the envelope of the input signal RFref. This delay time Td preferably is, for example, about 1 µs or less.

Second Preferred Embodiment

Figure 7:
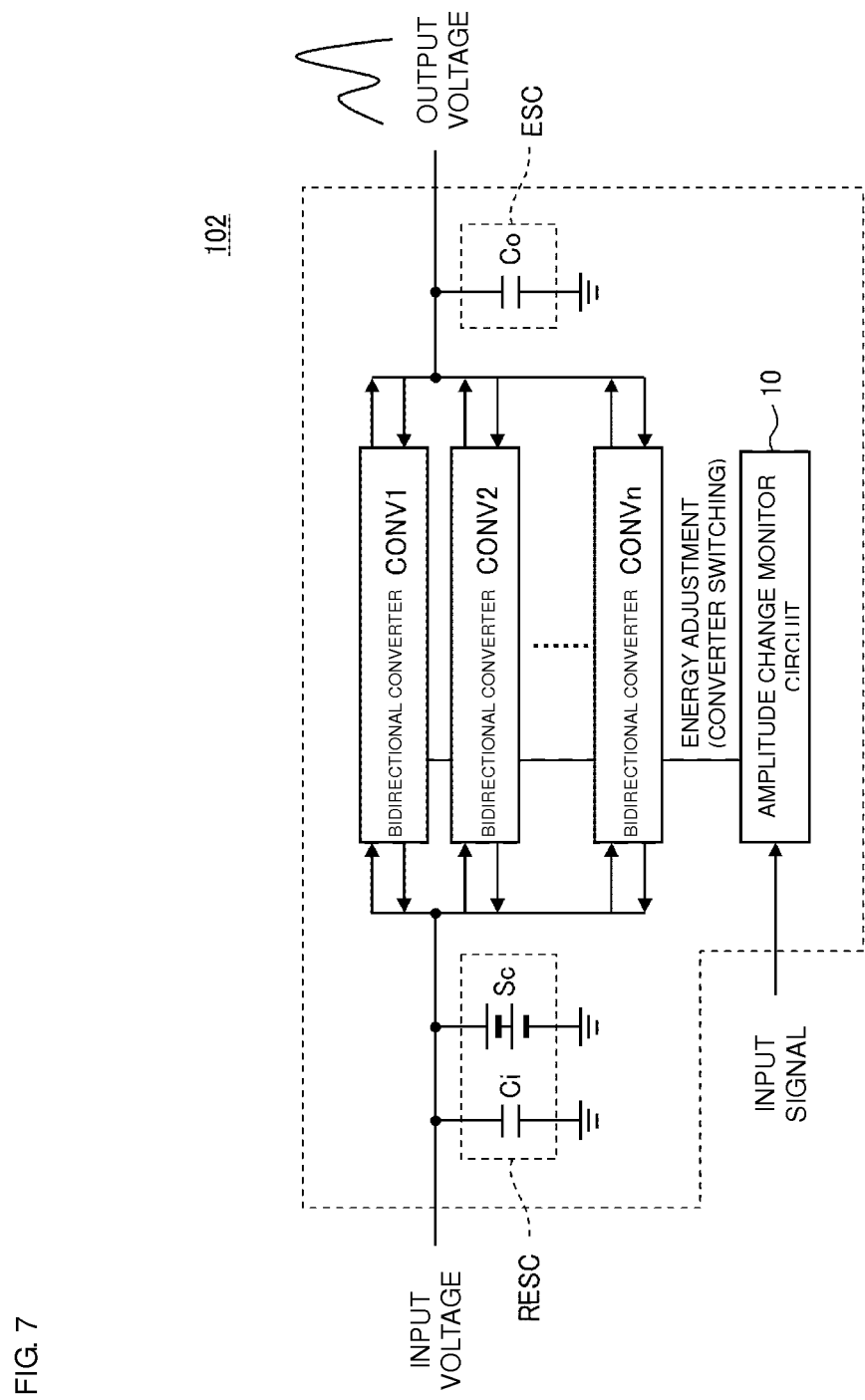
FIG. 7 is a block diagram illustrating a configuration of a power supply device 102 for a high frequency power amplification circuit according to a second preferred embodiment of the present invention.

FIG. 7 is a block diagram illustrating the configuration of a power supply device 102 for a high frequency power amplification circuit according to a second preferred embodiment of the present invention. The plurality of bidirectional converters CONV1, CONV2, ..., CONVn are provided between the input section for the input voltage and the output section for the output voltage. Each of these bidirectional converters is a converter that is capable of supplying and regenerating an electric charge. Right and left arrows at the input and output sections indicate the energy transfer directions. The amplitude change monitor circuit 10 receives, as an input, an input signal, which is an amplitude change signal (envelope) of a high frequency signal. The amplitude change monitor circuit 10 then controls the supply and regeneration of electric charges in the bidirectional converters CONV1, CONV2, ..., CONVn so that the output voltage follows the input signal. An output side energy storage device ESC is provided at an output section of the bidirectional converters, and a regeneration energy storage device RESC is provided at an input section of the bidirectional converters for storing regenerated energy from the output side energy storage device ESC.

The output side energy storage device ESC is, for example, a capacitor Co. Meanwhile, the regeneration energy storage device RESC is, for example, a capacitor Ci or a storage battery SC.

As a power supply voltage is supplied to a load (high frequency power amplification circuit) when the bidirectional converters CONV1, CONV2, ..., CONVn supply electric charges, the energy is stored in the energy storage device ESC. When the energy is regenerated from the output side of the bidirectional converters CONV1, CONV2, ..., CONVn, that energy is transferred to the input side, and thus the input voltage of the bidirectional converters CONV1, CONV2, ..., CONVn rises. Therefore, as illustrated in FIG. 7, the regeneration energy storage device RESC is provided. Through this, the increase in the input voltage of the bidirectional converters CONV1, CONV2, ..., CONVn is prevented or significantly reduced, making it possible to stabilize the input voltage.

Third Preferred Embodiment

Figure 8:
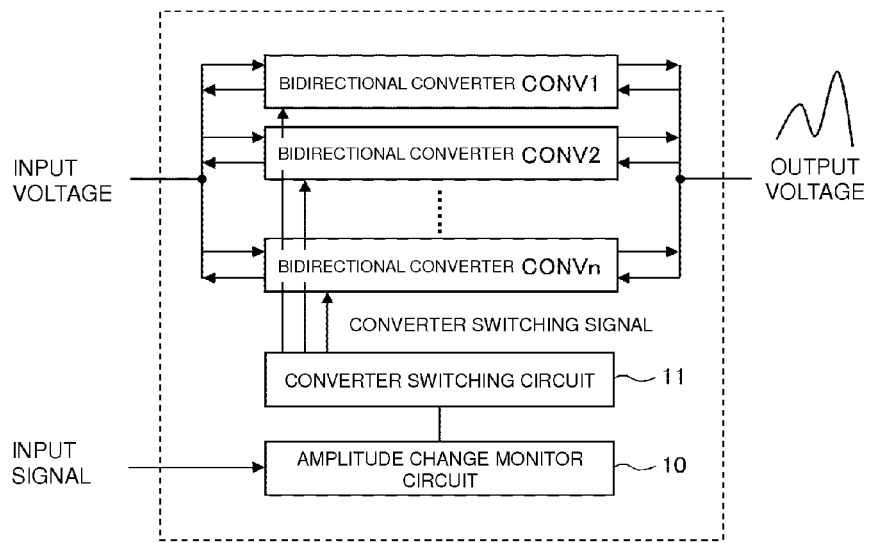
FIG. 8 is a block diagram illustrating a configuration of a power supply device 103 for a high frequency power amplification circuit according to a third preferred embodiment of the present invention.

FIG. 8 is a block diagram illustrating the configuration of a power supply device 103 for a high frequency power amplification circuit according to a third preferred embodiment of the present invention. The plurality of bidirectional converters CONV1, CONV2, ..., CONVn are provided between the input section for the input voltage and the output section for the output voltage. Each of these bidirectional converters is a converter that is capable of supplying and regenerating an electric charge. Right and left arrows at the input and output sections indicate the energy transfer directions. The amplitude change monitor circuit 10 receives, as an input, an input signal, which is an amplitude change signal of a high frequency signal. The amplitude change monitor circuit 10 then controls the supply and regeneration of electric charges in the bidirectional converters CONV1, CONV2, ..., CONVn so that the output voltage follows the amplitude change of the high frequency signal. In addition, a converter switching circuit 11 switches between a period in which energy is supplied and a period in which energy is regenerated on the basis of the amplitude of the input signal according to an amount of energy required by the load. In other words, the converter switching circuit 11 switches among the plurality of bidirectional converters so as to set which converters carry out a supply operation or a regeneration operation and also switches between a period in which energy is supplied and a period in which energy is regenerated.

By performing control to switch among the plurality of bidirectional converters in this manner, even when an input signal changes at high speed, the performance (responsiveness) of the output voltage in following the change is improved, and the output voltage is made to follow the input signal at high speed in accordance with the input signal.

Fourth Preferred Embodiment

Figure 9:
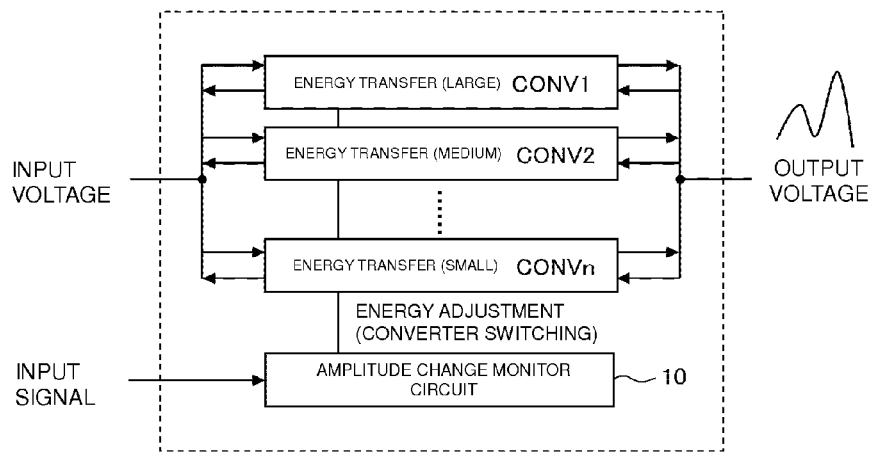
FIG. 9 is a block diagram illustrating a configuration of a power supply device 104 for a high frequency power amplification circuit according to a fourth preferred embodiment of the present invention.

FIG. 9 is a block diagram illustrating the configuration of a power supply device 104 for a high frequency power amplification circuit according to a fourth preferred embodiment of the present invention. The plurality of bidirectional converters CONV1, CONV2, ..., CONVn, which are each capable of supplying and regenerating an electric charge, are provided between the input section for the input voltage and the output section for the output voltage. Right and left arrows at the input and output sections indicate the energy transfer directions. The amplitude change monitor circuit 10 receives, as an input, an input signal, which is an amplitude change signal of a high frequency signal. The amplitude change monitor circuit 10 then controls the supply and regeneration of electric charges in the bidirectional converters CONV1, CONV2, ..., CONVn so that the output voltage follows the input signal.

The plurality of bidirectional converters CONV1, CONV2, ..., CONVn differ in terms of an amount of energy they supply and regenerate. The amplitude change monitor circuit 10 then selects one of or a combination selected from the plurality of bidirectional converters CONV1, CONV2, ..., CONVn so as to cause the amount of supplied or regenerated energy to follow the input signal at high resolution.

Figure 10:
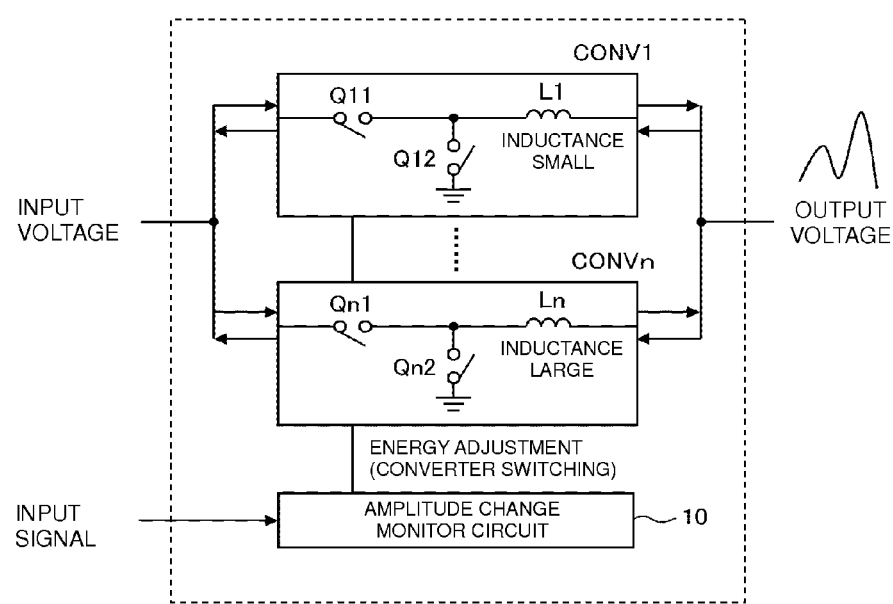
FIG. 10 is a diagram illustrating a detailed configuration example of bidirectional converters in the power supply device 104 for a high frequency power amplification circuit.

FIG. 10 is a diagram illustrating a detailed configuration example of the bidirectional converters in the power supply device 104 for a high frequency power amplification circuit. Here, the rectifying devices Q11, Qn1, and so on and the commutation devices Q12, Qn2, and so on are indicated by circuit symbols for a switching device. The amount of supplied and regenerated energy in the bidirectional converters is determined by the amount of electric charge supplied to the output side energy storage device, and this electric charge amount is an integral of a current to the output side energy storage device. The slope of the change in this current is in inverse proportion to the inductance of the choke coils L1, Ln, and so on. Therefore, if the inductance of the choke coils L1, Ln, and so on is large, the amount of supplied and regenerated energy in the bidirectional converters decreases, and if the inductance of the choke coils L1, Ln, and so on is small, the amount of supplied and regenerated energy in the bidirectional converters increases.

In this manner, varying the amount of supplied and regenerated energy in the bidirectional converters through the settings of inductance values of the choke coils makes it possible to vary the amount of supplied and regenerated energy per instance while the supply or regeneration time remains the same. In addition, a change di/dt in a current that flows in the circuit can be made gradual, enabling occurrence of noise to be prevented or significantly reduced. Furthermore, if a parasitic inductance component is used as the choke coil, or if the choke coil is defined by an air core (coreless) print substrate coil in which a conductor pattern is drawn on a substrate, circuit components can be omitted.

Fifth Preferred Embodiment

Figure 11:
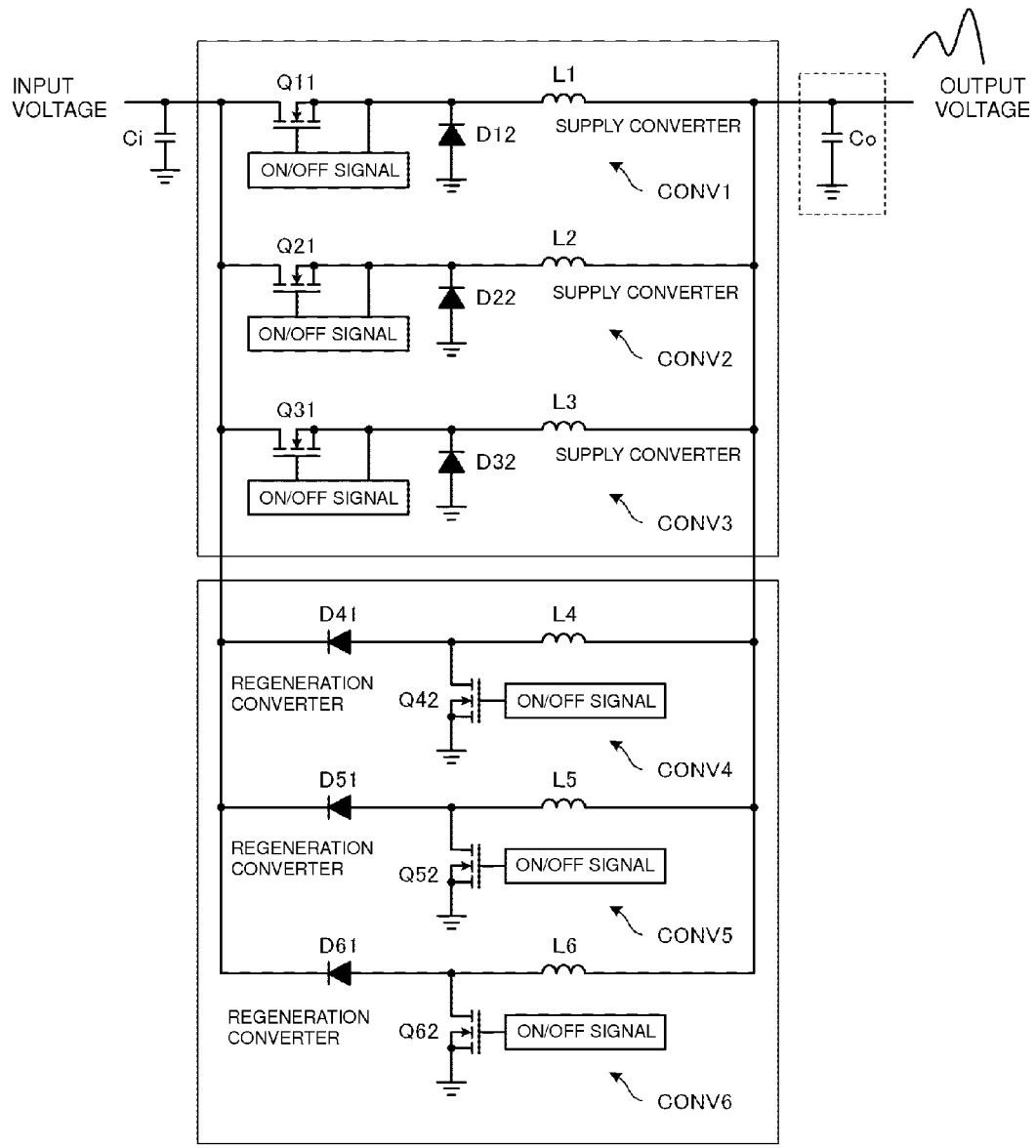
FIG. 11 is a block diagram illustrating a configuration of a power supply device 105 for a high frequency power amplification circuit according to a fifth preferred embodiment of the present invention.

FIG. 11 is a block diagram illustrating the configuration of a power supply device 105 for a high frequency power amplification circuit according to a fifth preferred embodiment of the present invention. In this power supply device 105 for a high frequency power amplification circuit, the converters CONV1, CONV2, and CONV3 are supply converters, and the converters CONV4, CONV5, and CONV6 are regeneration converters. These converters collectively function as a bidirectional converter.

The converter CONV1 includes a rectifying switching device Q11, a switching control circuit that supplies ON/OFF control signals to the rectifying device Q11, a commutation diode D12, and a choke coil L1. The converters CONV2 and CONV3 each have a similar configuration to the above.

The converter CONV4 includes a rectifying diode D41, a commutation switching device Q42, a switching control circuit that supplies ON/OFF control signals to the commutation switching device Q42, and a choke coil L4. The converters CONV5 and CONV6 each have a similar configuration to the above. Although not illustrated in FIG. 11, the switching control circuits are controlled by the amplitude change monitor circuit.

Figure 12:
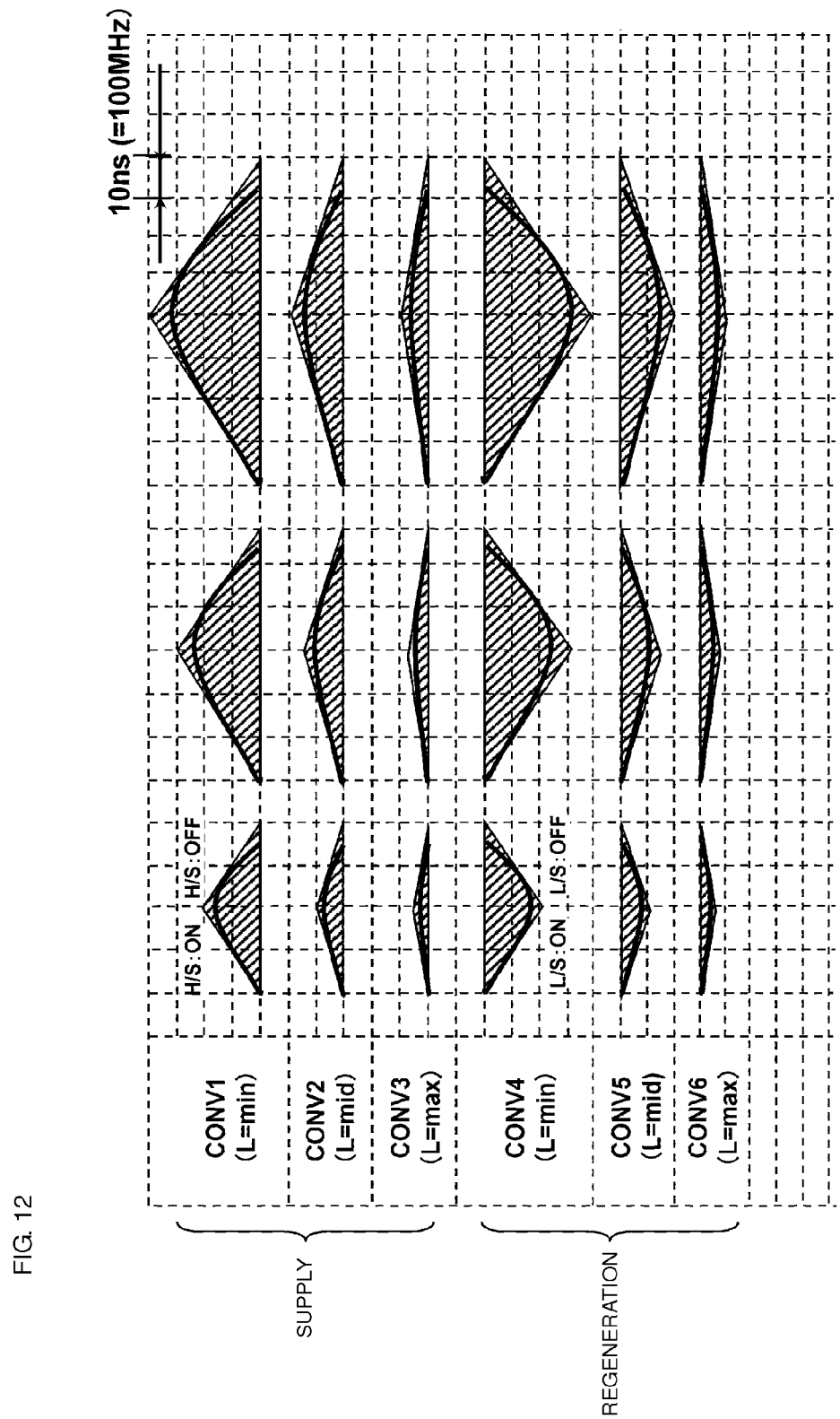
FIG. 12 is a diagram illustrating supply and regeneration patterns of electric charges by converters CONV1 to CONV6, which are included in the power supply device 105 for a high frequency power amplification circuit illustrated in FIG. 11.

FIG. 12 illustrates supply and regeneration patterns of electric charges by the converters CONV1 to CONV6 included in the power supply device 105 for a high frequency power amplification circuit illustrated in FIG. 11. Here, the inductance L of the choke coil in each of the converters CONV1 and CONV4 is minimum, the inductance L of the choke coil in each of the converters CONV2 and CONV5 is approximately in the middle, and the inductance L of the choke coil in each of the converters CONV3 and CONV6 is maximum. In addition, H/S indicates ON/OFF periods of the rectifying device (high side device), and L/S indicates ON/OFF periods of the commutation device (low side device). In FIG. 12, the differences in the amount of supplied and regenerated energy (electric charge) resulting from the difference in the inductance of the choke coils in the respective converters are indicated while being arranged in the vertical direction. In addition, three patterns of different supply and regeneration times are indicated while being arranged in the horizontal direction.

The output energy storage device (capacitor Co illustrated in FIG. 11) is thus charged and discharged through the total of 18 supply and regeneration patterns of electric charges, and the output voltage is varied. Although the diagram illustrating the 18 patterns of the amounts of electric charges illustrated here is a microscopic diagram in which the applied voltages of the choke coils do not change, the amount of electric charge takes on a sine half wave shape that follows along a change in the output voltage Vout, and thus noise is reduced. Furthermore, the amount of electric charge in each pattern can take various modes through setting the current in the choke coil to be discontinuous, to be continuous, to be a combination of being discontinuous and continuous, to resonate, and so on.

Figure 13:
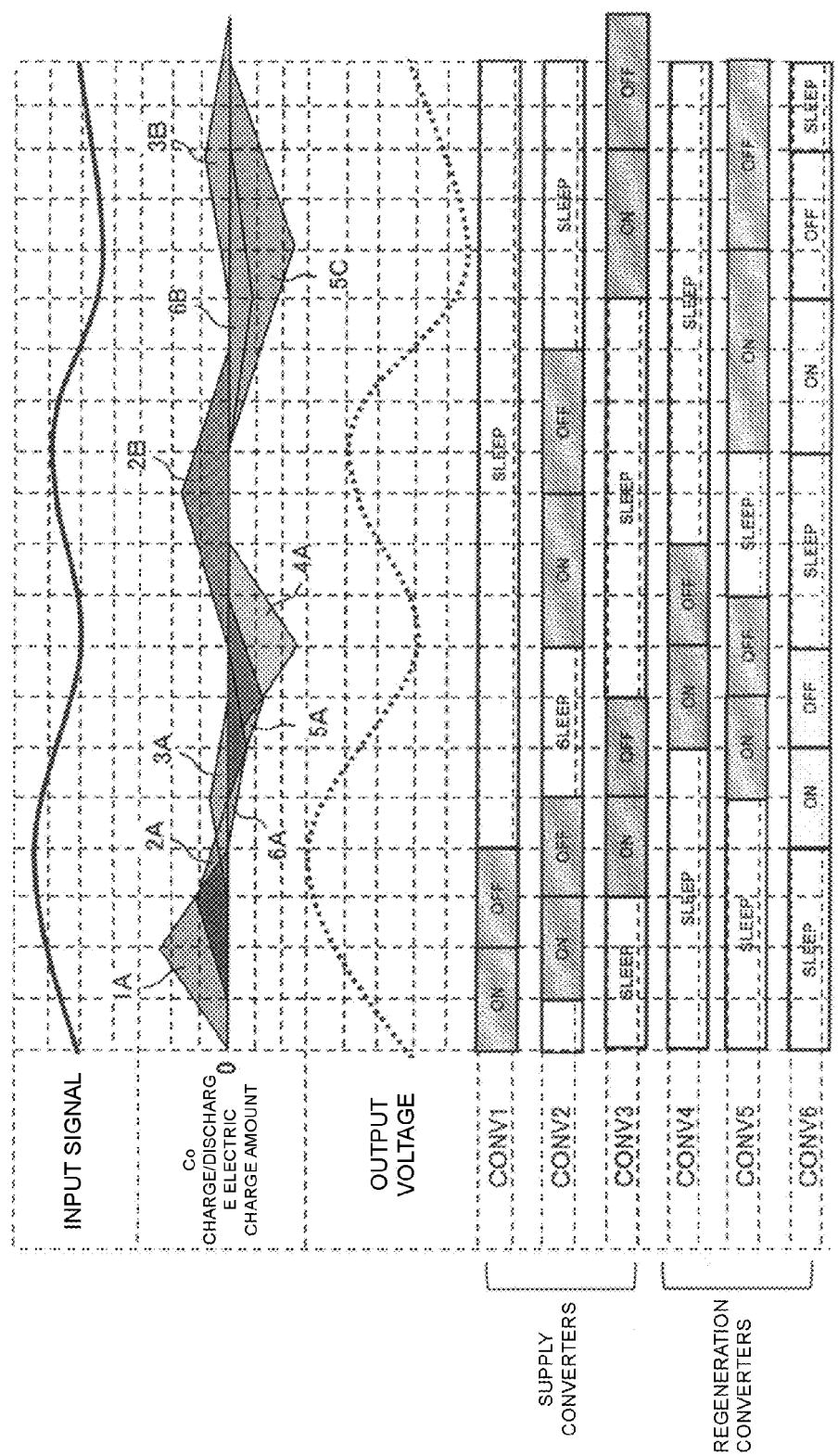
FIG. 13 is a diagram illustrating how an output voltage is made to follow an input signal through 18 patterns of amounts of electric charges to be supplied and regenerated.

FIG. 13 is a diagram illustrating how the output voltage is made to follow the input signal through 18 patterns of amounts of supplied and regenerated electric charges. The horizontal axis corresponds to a timing chart indicates ON, OFF, and SLEEP timings of the supply converters CONV1, CONV2, and CONV3 and the regeneration converters CONV4, CONV5, and CONV6. As illustrated in FIG. 12, in a supply converter, "ON" indicates an ON period of the rectifying device (high side device), and "OFF" indicates an OFF period of the rectifying device. Furthermore, in a regeneration converter, "ON" indicates an ON period of the commutation device (low side device), and "OFF" indicates an OFF period of the commutation device.

The amplitude change monitor circuit provides switching signals to the switching control circuit in each converter in accordance with the input signal following this timing chart. Since the output energy storage device (capacitor Co) is charged and discharged in accordance with the amount of supplied and regenerated electric charges in each converter, the output voltage varies as illustrated in FIG. 13. It can be seen that this output voltage follows the input signal.

As a unit that modifies the amount of energy supplied or regenerated by the plurality of bidirectional converters, it is advantageous to carry out discrete control in which a sleep and a burst are combined as in the example above especially in the case where the frequency of the input signal is high. Through this, an increase in the switching frequency is prevented or significantly reduced, and the loss in the switching device is reduced.

Note that the ON or OFF control of the switching device (transistor, diode, etc.) included in the bidirectional converter can be carried out not only by time control in which a sleep and a burst are combined but also by controlling the time ratio or the frequency.

Sixth Preferred Embodiment

Figure 14:
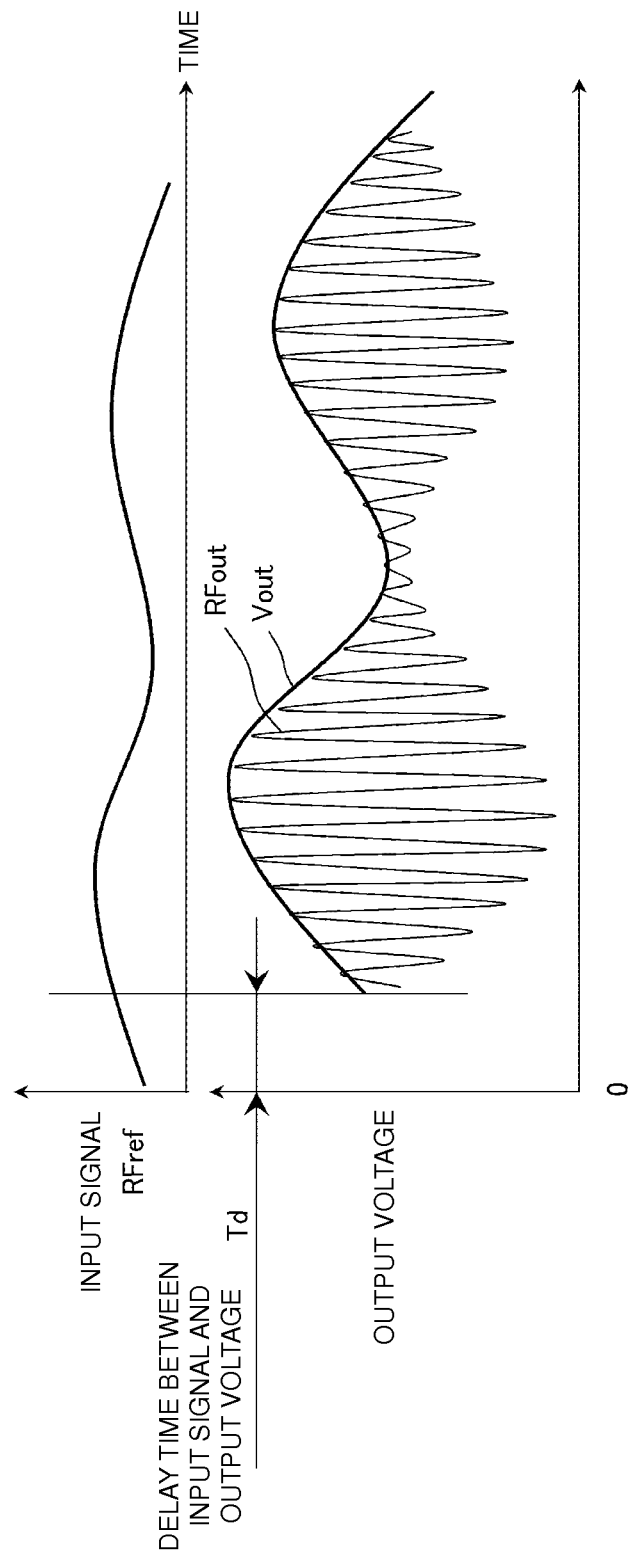
FIG. 14 is a diagram illustrating the relationship among an input signal, a high frequency signal, and an output voltage.

FIG. 14 is a diagram illustrating the relationship among the input signal, the high frequency signal, and the output voltage. Here, a high frequency component of the output voltage is a switching frequency component of each bidirectional converter and follows the input signal RFref through supply and regeneration of electric charges in each bidirectional converter.

Due to the electric charge supply/regeneration operation in each bidirectional converter and a delay in a response of the amplitude change monitor circuit, the envelope following output voltage Vout is delayed by the delay time Td relative to the input signal RFref.

A power supply device for a high frequency power amplification circuit and a high frequency power amplification device according to a sixth preferred embodiment of the present invention makes a correction in an amount equivalent to the delay time Td.

Figure 15:
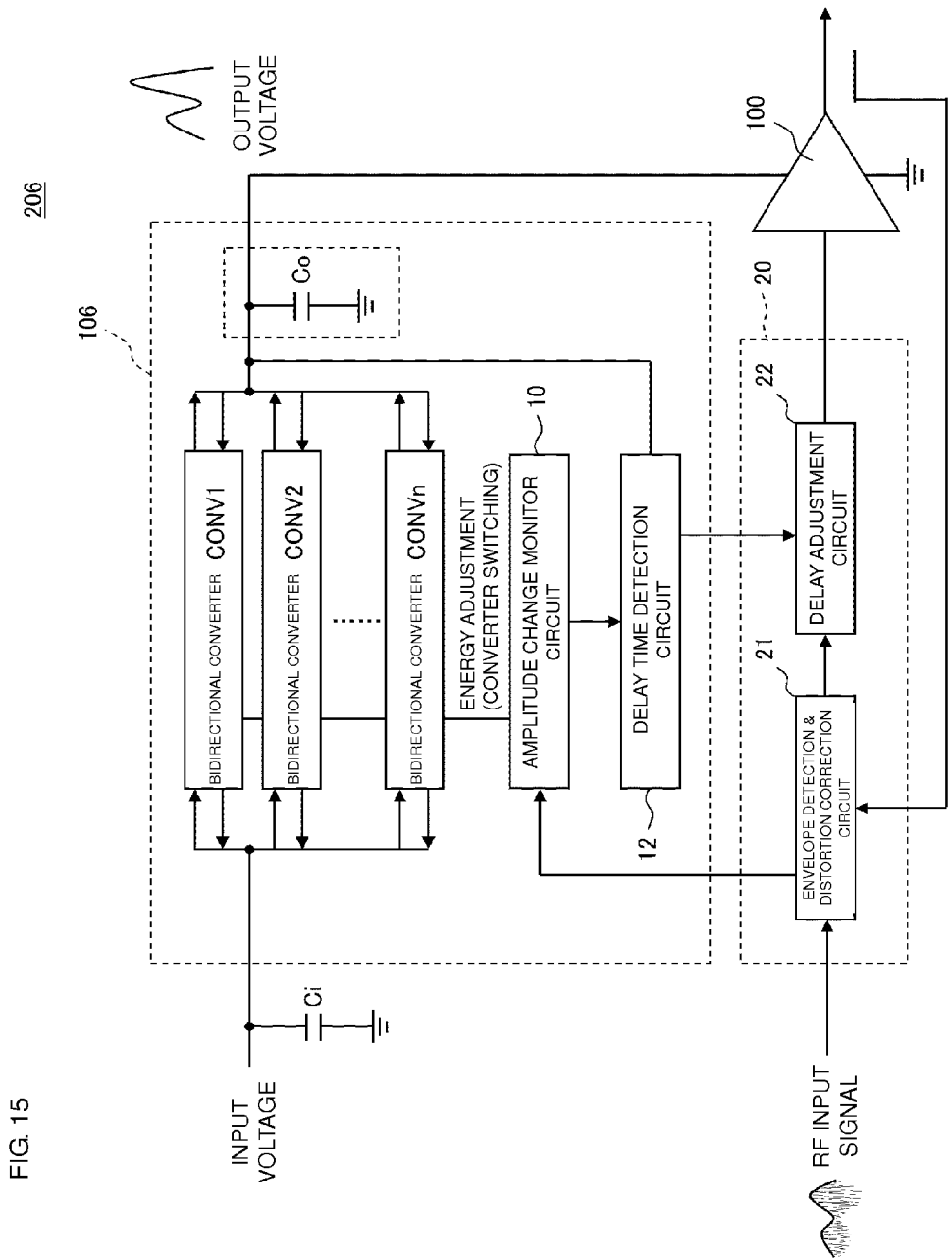
FIG. 15 is a block diagram illustrating configurations of a power supply device 106 for a high frequency power amplification circuit and of a high frequency power amplification device 206 according to a sixth preferred embodiment of the present invention.

FIG. 15 is a block diagram illustrating the configurations of a power supply device 106 for a high frequency power amplification circuit and of a high frequency power amplification device 206 of the sixth preferred embodiment. This high frequency power amplification device 206 includes the power supply device 106 for a high frequency power amplification circuit, an RF signal processing circuit 20, and the high frequency power amplification circuit 100.

The plurality of bidirectional converters CONV1, CONV2, . . . , CONVn are provided between the input section for the input voltage and the output section for the output voltage. Each of these bidirectional converters is a converter that is capable of supplying and regenerating an electric charge. The amplitude change monitor circuit 10 receives an envelope signal outputted from an envelope detection and distortion correction circuit 21 as an input. The amplitude change monitor circuit 10 then controls the supply and regeneration of electric charges in the bidirectional converters CONV1, CONV2, . . . , CONVn so that the output voltage follows the amplitude change of the high frequency signal. A delay time detection circuit 12 compares an envelope signal detected by the amplitude change monitor circuit 10 with an output voltage signal to detect a delay time.

The envelope detection and distortion correction circuit 21 feeds back a signal that has been distributed from an output signal of the high frequency power amplification circuit 100 to an RF input signal to correct distortion. A delay adjustment circuit 22 receives a signal that corresponds to the delay time detected by the delay time detection circuit 12 as an input and delays the output signal of the distortion correction circuit 21 to output the result to the high frequency power amplification circuit 100.

In this manner, the RF input signal is delayed by a delay time of the power supply device 106 for a high frequency power amplification circuit and is outputted to the high frequency power amplification circuit 100. Thus, a power supply voltage that follows a signal to be amplified by the high frequency power amplification circuit 100 is applied.

Seventh Preferred Embodiment

Figure 16:
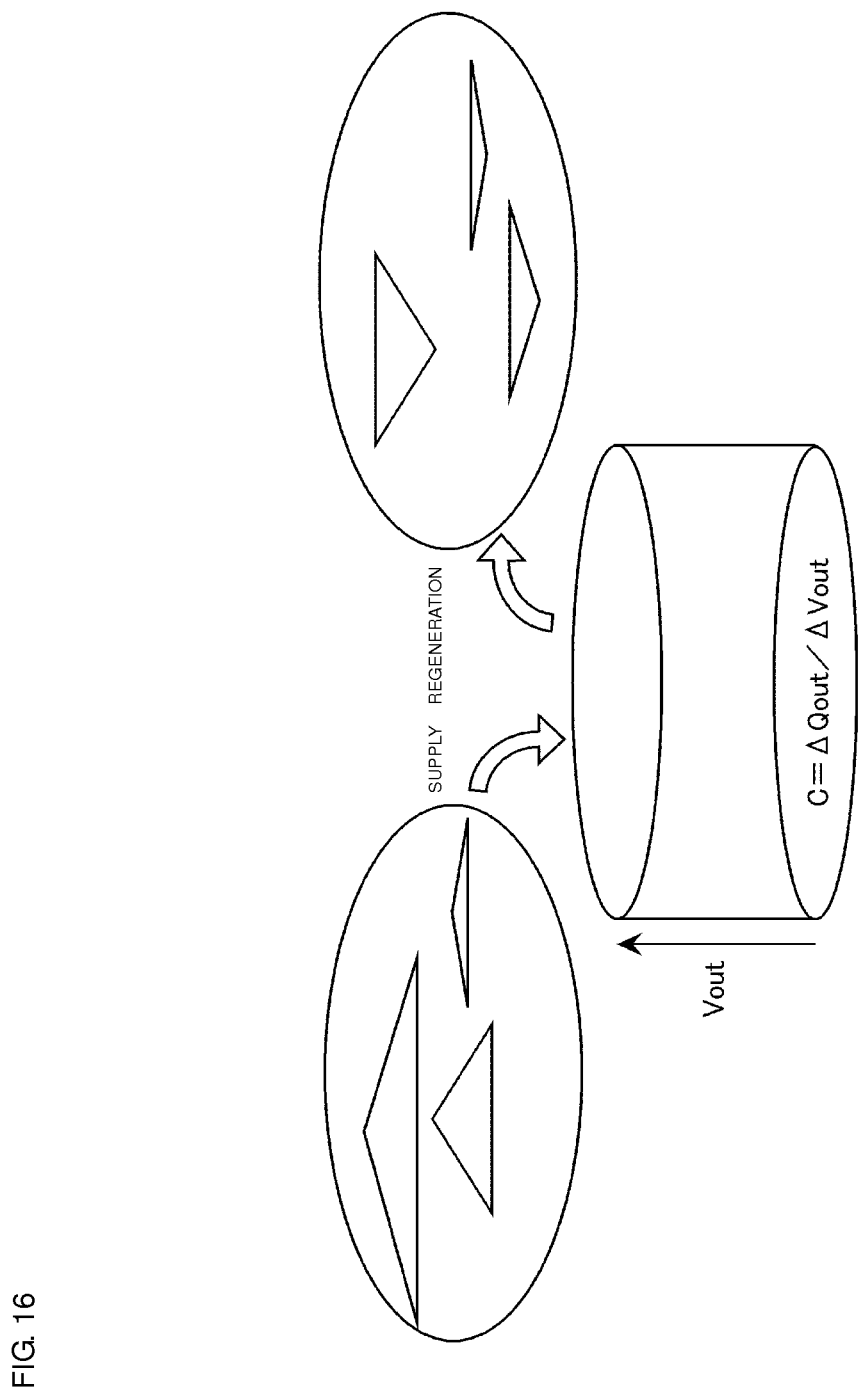
FIG. 16 is a diagram illustrating a principle of an output voltage amplitude monitor circuit in a power supply device for a high frequency power amplification circuit according to a seventh preferred embodiment of the present invention.

FIG. 16 is a diagram illustrating the principle of an output voltage amplitude monitor circuit in a power supply device for a high frequency power amplification circuit according to a seventh preferred embodiment of the present invention. Aside from the output capacitor Co described in each of the above-described preferred embodiments, a capacitance component is provided at an output section of each bidirectional converter, and another capacitance component is provided in a power supply line of the high frequency power amplification circuit as well. Thus, the capacitance of the output side energy storage device is not determined only by the output capacitor Co in some cases. Therefore, the amplitude change monitor circuit 10 detects (monitors) the amplitude of the output voltage as necessary and grasps whether or not the output voltage amplitude is normal, that is, whether or not the output voltage amplitude is in proportion to the input signal. The seventh preferred embodiment is one of the methods for detecting this amplitude of the output voltage.

While the capacitance of the capacitor Co is indicated by C and an amount of electric charge to be charged or discharged is indicated by $\Delta Q_{out}$, a voltage change $\Delta V_{out}$ resulting from the charge or discharge of the output side energy storage device (e.g., the capacitor Co) has the following relationship.

$$C = \Delta Q_{out} / \Delta V_{out}$$

$$\Delta V_{out} = \Delta Q_{out} / C$$

Thus, the change $\Delta$Vout in the output voltage is detected from the amount of electric charge $\Delta$Qout supplied or regenerated through the supply operation of the bidirectional converter and the capacitance C of the output side energy storage device.

Eighth Preferred Embodiment

Figure 17:
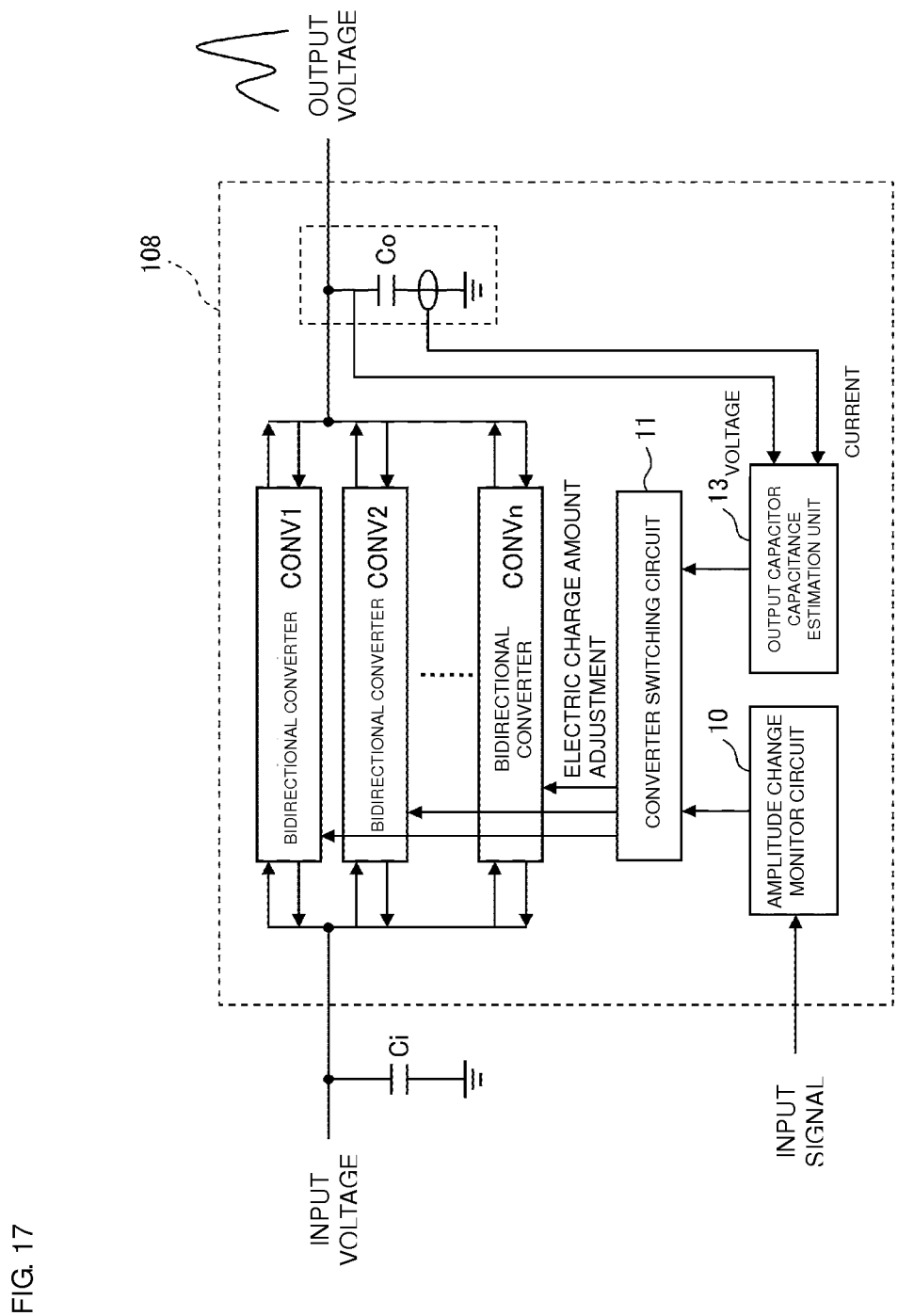
FIG. 17 is a block diagram illustrating a configuration of a power supply device 108 for a high frequency power amplification circuit according to an eighth preferred embodiment of the present invention.

FIG. 17 is a block diagram illustrating the configuration of a power supply device 108 for a high frequency power amplification circuit according to an eighth preferred embodiment of the present invention. The plurality of bidirectional converters CONV1, CONV2, . . . , CONVn, which are each capable of supplying and regenerating an electric charge, are provided between the input section for the input voltage and the output section for the output voltage. The amplitude change monitor circuit 10 receives, as an input, an input signal, which is an amplitude change signal of a high frequency signal. The amplitude change monitor circuit 10 then controls the supply and regeneration of electric charges in the bidirectional converters CONV1, CONV2, . . . , CONVn so that the output voltage follows the amplitude change of the high frequency signal. The converter switching circuit 11 switches between a period in which energy is supplied and a period in which energy is regenerated on the basis of the input signal according to an amount of energy required by the load. In other words, the converter switching circuit 11 switches among the plurality of bidirectional converters so as to set which converters carry out a supply operation or a regeneration operation. Furthermore, an output capacitor capacitance estimation unit 13 is provided to estimate the capacitance of the capacitor Co, which is the output energy storage device. This output capacitor capacitance estimation unit 13 receives the voltage and the current of the capacitor Co as an input and estimates the capacitance of the capacitor Co. The capacitance value C of the output capacitor Co is calculated through C=$\Delta$Qout/$\Delta$Vout, in which $\Delta$Vout indicates the amount of change in the voltage and $\Delta$Qout indicates the amount of transferred electric charge. This calculation execution unit is realized with an integrated circuit having a calculation function (CPU, DSP, FPGA, CPLD, etc.).

The converter switching circuit 11 switches between the supply time and the regeneration time of each bidirectional converter on the basis of the input signal (envelope of the high frequency signal) inputted by the amplitude change monitor circuit 10 and the estimated capacitance of the capacitor Co. Through this, although the output voltage is controlled by controlling the amount of transferred electric charge of the output capacitor Co, a variation in the capacitance value of the output capacitor becomes a problem. In the present preferred embodiment, however, as the capacitance of the output capacitor is estimated, the precision can be enhanced by carrying out, in addition to feedforward control that is based on the input signal, feedback control of the capacitance value estimated from the voltage and the current of the output capacitor Co.

Ninth Preferred Embodiment

Figure 18:
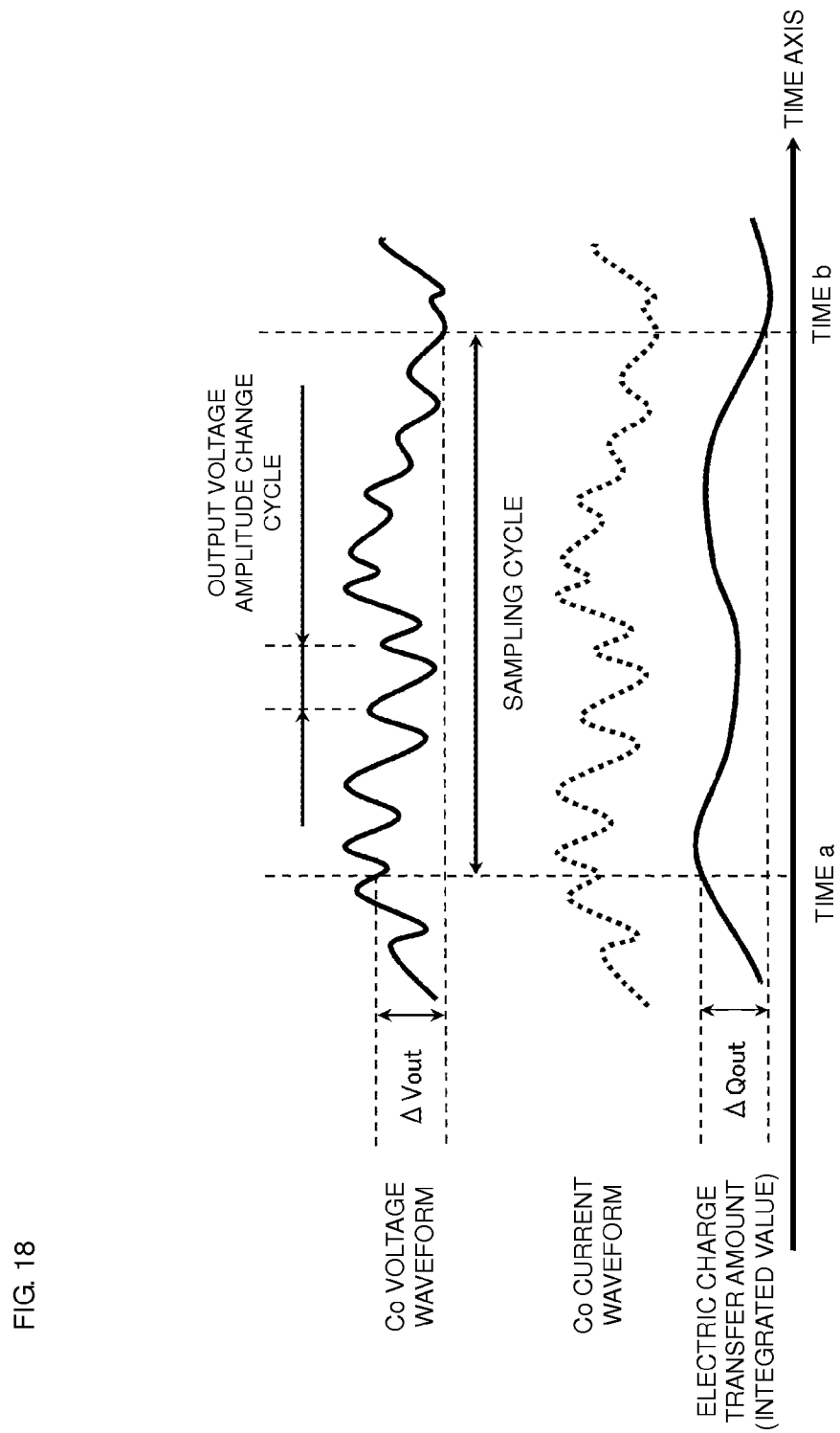
FIG. 18 is a diagram illustrating an exemplary sampling timing for estimating the capacitance of an output capacitor in a power supply device for a high frequency power amplification circuit according to a ninth preferred embodiment of the present invention.

FIG. 18 is a diagram illustrating an exemplary sampling timing used to estimate the capacitance of an output capacitor in a power supply device for a high frequency power amplification circuit according to a ninth preferred embodiment of the present invention. When processing the voltage and the current of the output capacitor Co in digital values, the voltage and the current are sampled, in some cases, at frequencies that are higher than the frequency of the amplitude change of the output voltage or sampled, in other cases, at frequencies lower than the frequency of the amplitude change of the output voltage. When sampling at lower frequencies, the sampling frequency is reduced, and the capacitance of the output capacitor Co is estimated from data between two points.

In this manner, even if the sampling frequency is lower than the signal frequency, the capacitance of the output capacitor Co can be calculated on the basis of $\Delta$Vout and $\Delta$Qout described above. Furthermore, by setting the sampling frequency to be lower than the signal frequency, computation amount, per unit time, required to calculate the capacitance of the output capacitor Co can be reduced.

Tenth Preferred Embodiment

Figure 19:
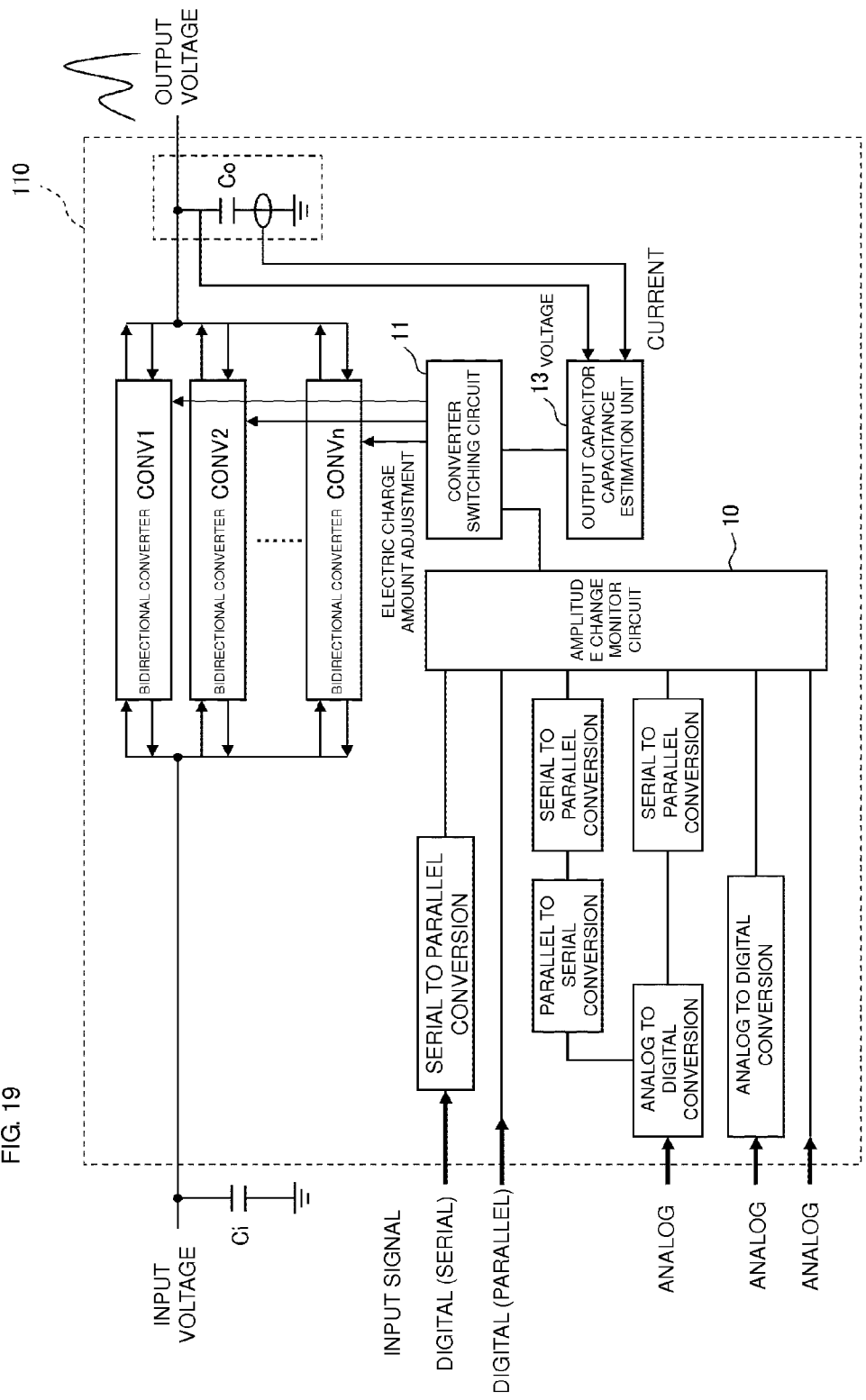
FIG. 19 is a block diagram illustrating a configuration of a power supply device 110 for a high frequency power amplification circuit according to a tenth preferred embodiment of the present invention.

FIG. 19 is a block diagram illustrating the configuration of a power supply device 110 for a high frequency power amplification circuit according to a tenth preferred embodiment of the present invention. The power supply device 110 includes the plurality of bidirectional converters CONV1, CONV2, . . . , CONVn, which are each capable of supplying and regenerating an electric charge and are provided between the input section for the input voltage and the output section for the output voltage, the amplitude change monitor circuit 10, the converter switching circuit 11, and the output capacitor capacitance estimation unit 13.

The amplitude change monitor circuit 10 can receive an analog or digital input signal and includes an AD converter that digitizes an analog signal. If the input signal is a digital signal, which is a parallel or serial signal, the amplitude change monitor circuit 10 includes a serializer, which converts a parallel signal into a serial signal, or includes a deserializer, which converts a serial signal into a parallel signal. If the input signal is a parallel signal, an LVDS or the like can be listed, and if the input signal is a serial signal, a high speed interface aside from an I2C and an SPI can be listed. The use of these interfaces makes it possible to handle signals that can be applied to various data processes.

Note that each piece of data is preferably such that a delay time to be generated inside the power supply device 110 for a high frequency power amplification circuit is corrected in advance and the amplitude phases of the input signal and the output voltage match each other.

Eleventh Preferred Embodiment

Figure 20:
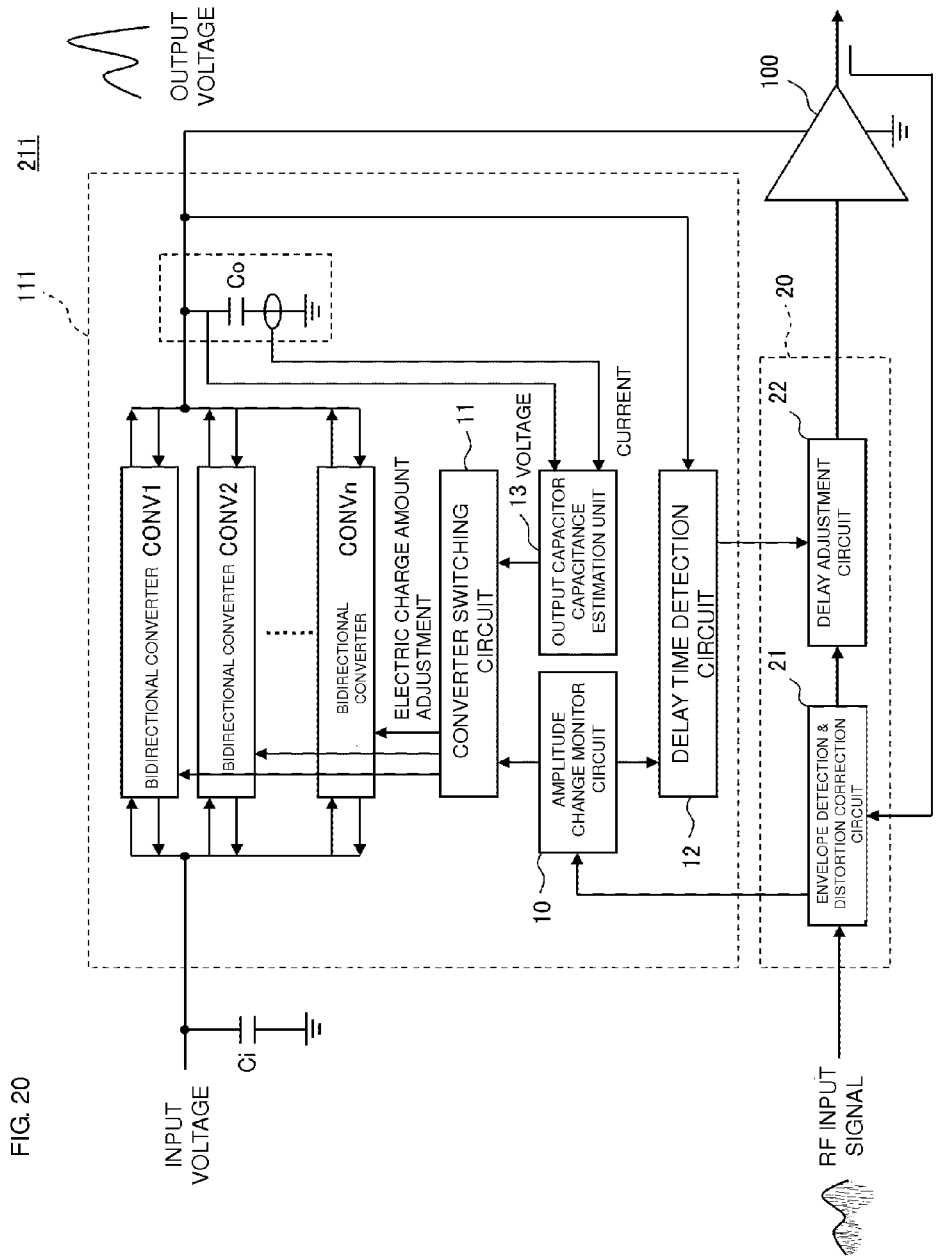
FIG. 20 is a block diagram illustrating configurations of a power supply device 111 for a high frequency power amplification circuit and of a high frequency power amplification device 211 according to an eleventh preferred embodiment of the present invention.

FIG. 20 is a block diagram illustrating the configurations of a power supply device 111 for a high frequency power amplification circuit and of a high frequency power amplification device 211 according to an eleventh preferred embodiment of the present invention. This high frequency power amplification device 211 includes the power supply device 111 for a high frequency power amplification circuit, the RF signal processing circuit 20, and the high frequency power amplification circuit 100. The power supply device 111 for a high frequency power amplification circuit includes the plurality of bidirectional converters CONV1, CONV2, . . . , CONVn, which are each capable of supplying and regenerating an electric charge and are provided between the input section for the input voltage and the output section for the output voltage, the amplitude change monitor circuit 10, the converter switching circuit 11, the output capacitor capacitance estimation unit 13, and the delay time detection circuit 12.

Other configurations are similar to those of the power supply devices for a high frequency power amplification circuit described in the sixth and eighth preferred embodiments. In this manner, the following precision of the output voltage is further enhanced by making a correction in an amount equivalent to the delay time and by carrying out feedforward control that is based on the input signal as well as feedback control of the capacitance value estimated from the voltage and the current of the output capacitor Co.

Twelfth Preferred Embodiment

Figure 21:
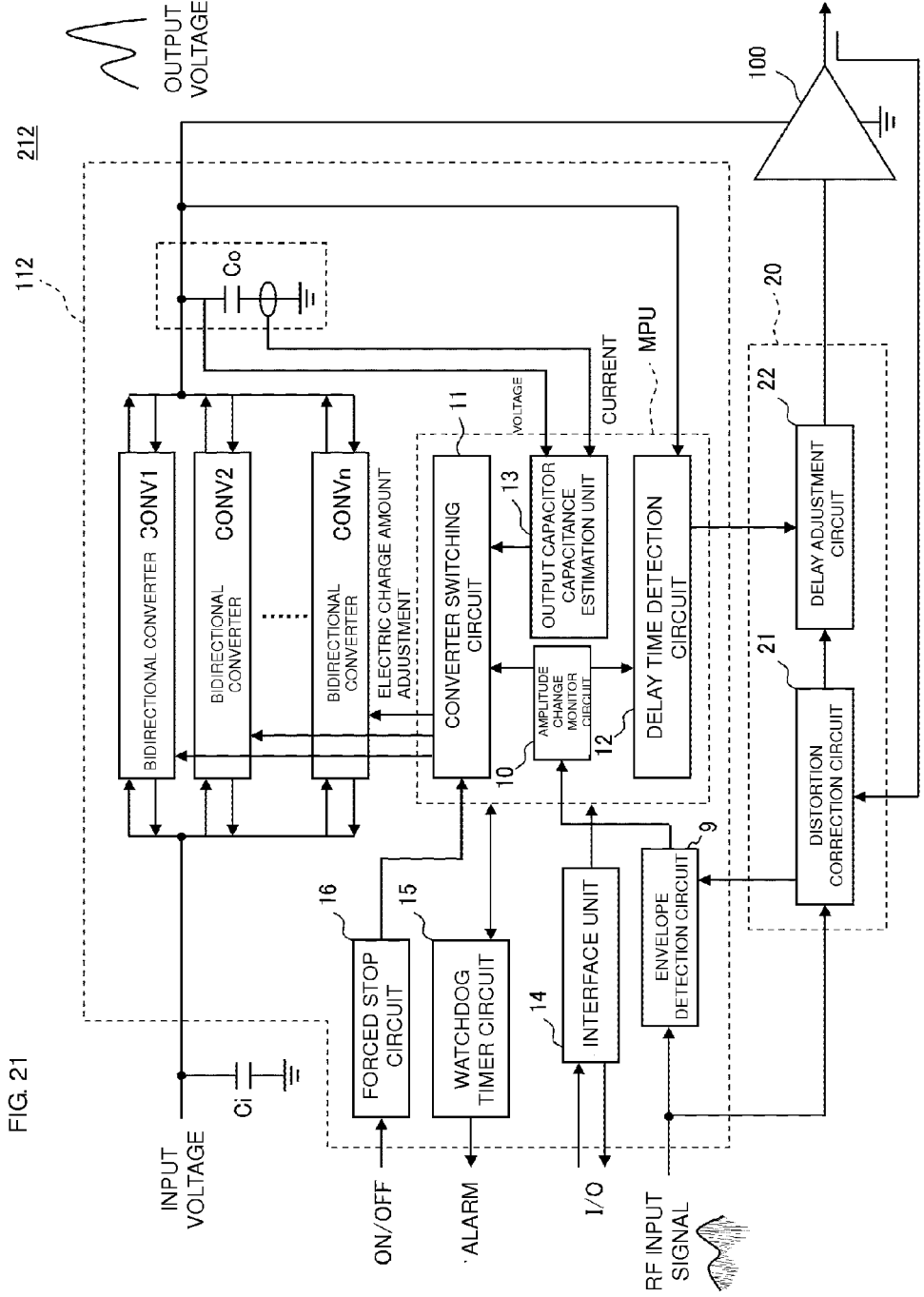
FIG. 21 is a block diagram illustrating configurations of a power supply device 112 for a high frequency power amplification circuit and of a high frequency power amplification device 212 according to a twelfth preferred embodiment of the present invention.

FIG. 21 is a block diagram illustrating the configurations of a power supply device 112 for a high frequency power amplification circuit and of a high frequency power amplification device 212 according to a twelfth preferred embodiment of the present invention.

This power supply device 112 for a high frequency power amplification circuit of the twelfth preferred embodiment includes a computation microprocessor (CPU, DSP, FPGA, CPLD, etc.) MPU as a control unit if the power supply device 112 carries out digital control, and the converter switching circuit (converter switching control function) 11 constituted by a digital ON/OFF control circuit, a forced stop circuit (kill switch) 16 that forces the function of the converter switching circuit 11 to stop when a malfunction occurs, a watchdog timer circuit 15 that outputs an alarm when the computation microprocessor MPU malfunctions, and an interface unit 14 to control the device. Other configurations are similar to those of the preferred embodiments described above.

Thirteenth Preferred Embodiment

Figure 22:
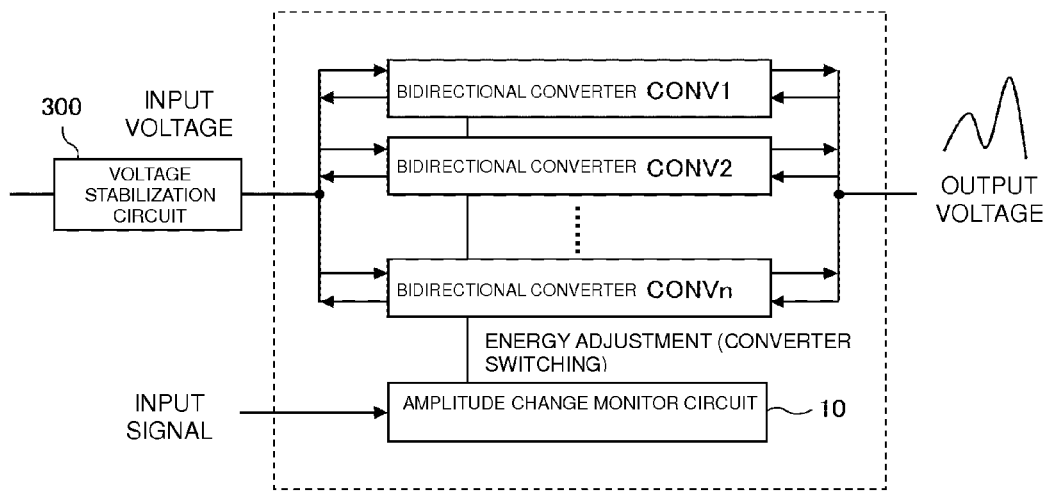
FIG. 22 is a block diagram illustrating a configuration of a power supply device 113 for a high frequency power amplification circuit according to a thirteenth preferred embodiment of the present invention.

FIG. 22 is a block diagram illustrating the configuration of a power supply device 113 for a high frequency power amplification circuit according to a thirteenth preferred embodiment of the present invention. The power supply device 113 for a high frequency power amplification circuit includes the plurality of bidirectional converters CONV1, CONV2, ..., CONVn, which are each capable of supplying and regenerating an electric charge and are provided between the input section for the input voltage and the output section for the output voltage, and the amplitude change monitor circuit 10. The power supply device 113 further includes a voltage stabilization circuit 300 provided at the input section for the input voltage.

The voltage stabilization circuit 300 is a non-insulated type or insulated type DC-DC converter and stabilizes the input voltage of the bidirectional converters CONV1, CONV2, ..., CONVn at an optimal voltage. If this voltage stabilization circuit 300 is constituted by an insulated type DC-DC converter, overcurrent or overvoltage in a path along the voltage stabilization circuit 300, the bidirectional converters, and the high frequency amplification circuit is prevented at the time of a component failure.

Figure 23:
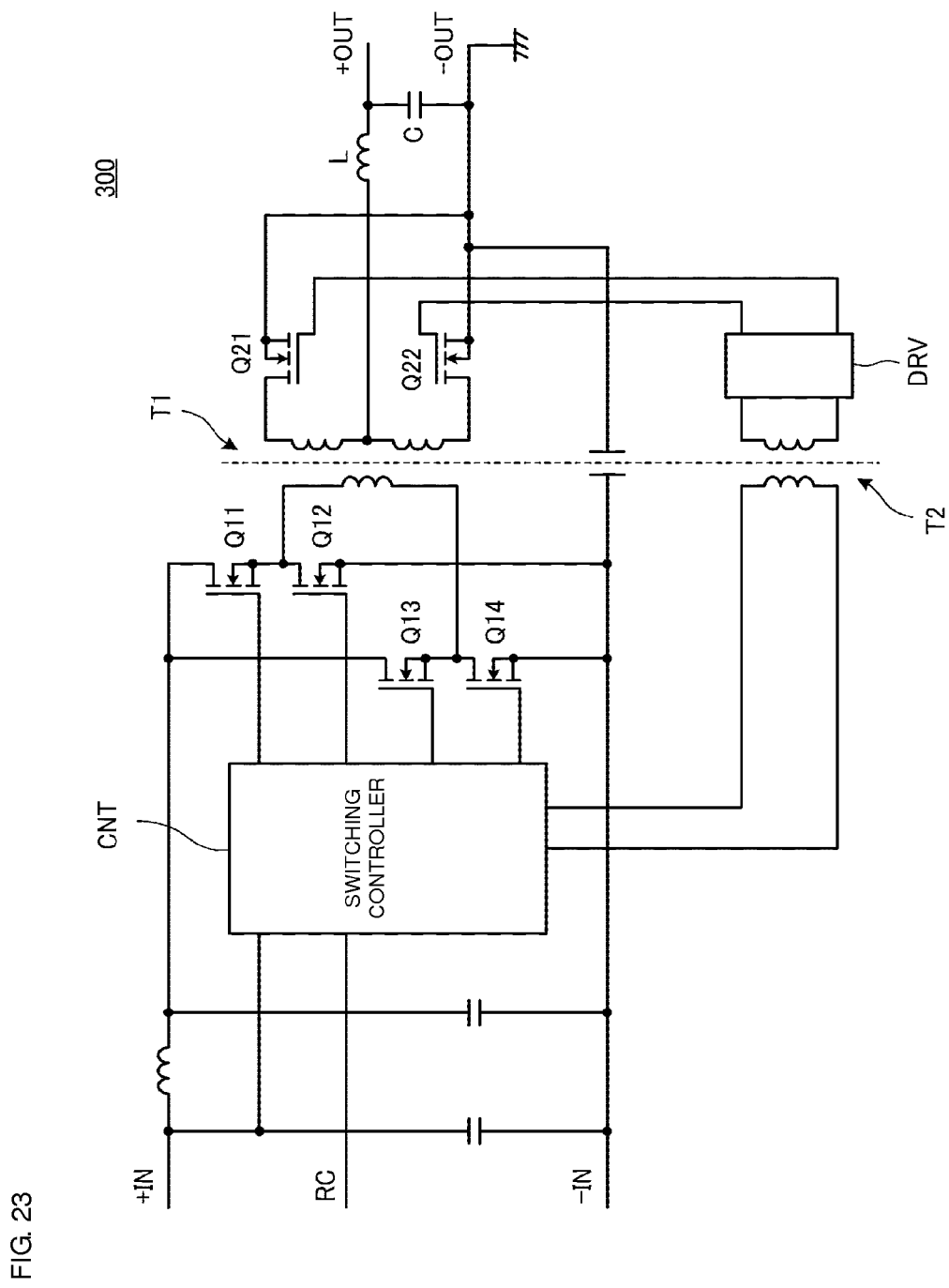
FIG. 23 is a detailed circuit diagram of a voltage stabilization circuit 300.

FIG. 23 is a detailed circuit diagram of the voltage stabilization circuit 300. Switching devices Q11, Q12, Q13, and Q14 are connected to a transformer T1 at a primary side thereof, and switching devices Q21 and Q22 are connected to this transformer T1 at a secondary side thereof. A choke coil L and a capacitor C are connected to a center tap of secondary winding of the transformer T1. A switching controller CNT receives an externally supplied remote signal RC as an input and outputs control signals to the gates of the switching devices Q11, Q12, Q13, and Q14. In addition, the switching controller CNT outputs control signals for the switching devices Q21 and Q22 to a drive circuit DRV through a pulse transformer T2.

In this manner, the voltage stabilization circuit 300 functions as an insulated type DC-DC converter in which the primary side is of a full bridge system and the secondary side is of a center tap system. The voltage stabilization circuit 300, for example, receives a voltage of −48 V as an input and outputs stabilized +70 V.

As the voltage stabilization circuit 300, various other types of converters such as a non-insulated chopper converter, an insulated type forward converter, an insulated type flyback converter, a half bridge type converter, and an LLC resonant converter may be used.

Fourteenth Preferred Embodiment

Figure 24:
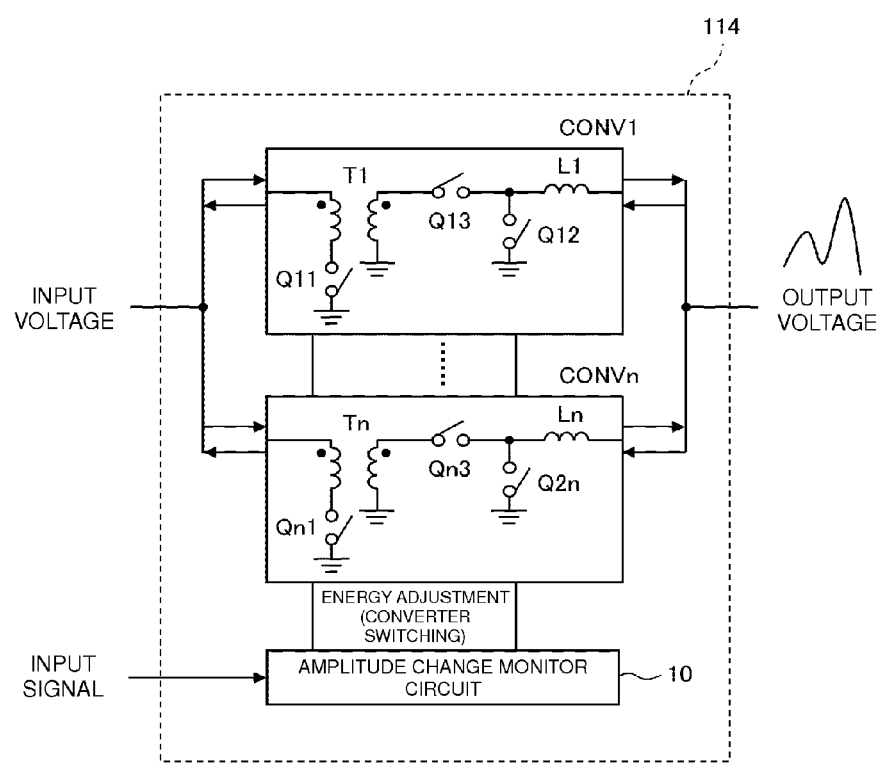
FIG. 24 is a block diagram illustrating a configuration of a power supply device 114 for a high frequency power amplification circuit according to a fourteenth preferred embodiment of the present invention.

FIG. 24 is a block diagram illustrating the configuration of a power supply device 114 for a high frequency power amplification circuit according to a fourteenth preferred embodiment of the present invention. The power supply device 114 for a high frequency power amplification circuit includes the plurality of bidirectional converters CONV1, ..., CONVn, which are each capable of supplying and regenerating an electric charge and are provided between the input section for the input voltage and the output section for the output voltage, and the amplitude change monitor circuit 10.

Each of the bidirectional converters is constituted by an insulated type forward converter. For example, the bidirectional converter CONV1 includes the transformer T1, the switching devices Q11, Q12, and Q13, and the choke coil L1. The switching device Q11 switches the current that flows in the primary winding of the transformer T1, the switching device Q13 rectifies the voltage induced in the secondary winding of the transformer T1, and the switching device Q12 commutates the current that flows in the choke coil L1. The other bidirectional converters are configured similarly to the above.

In this manner, if the supply or regeneration converter is constituted by an insulated type converter, this insulated type converter can not only supply and regenerate energy but also carry out voltage conversion, and thus a DC-DC converter (pre-regulator) to obtain a predetermined output voltage becomes unnecessary. Therefore, the overall frequency of voltage conversion is reduced, preventing efficiency degradation. For example, when the efficiency of the pre-regulator is 90% and the efficiency of the bidirectional converter is 90%, the overall power conversion efficiency turns out to be 90%×90%=81% in the case of two-stage conversion. If, however, the voltage conversion is also carried out in the bidirectional converter, the power conversion efficiency is only 90%.

Fifteenth Preferred Embodiment

Figure 25:
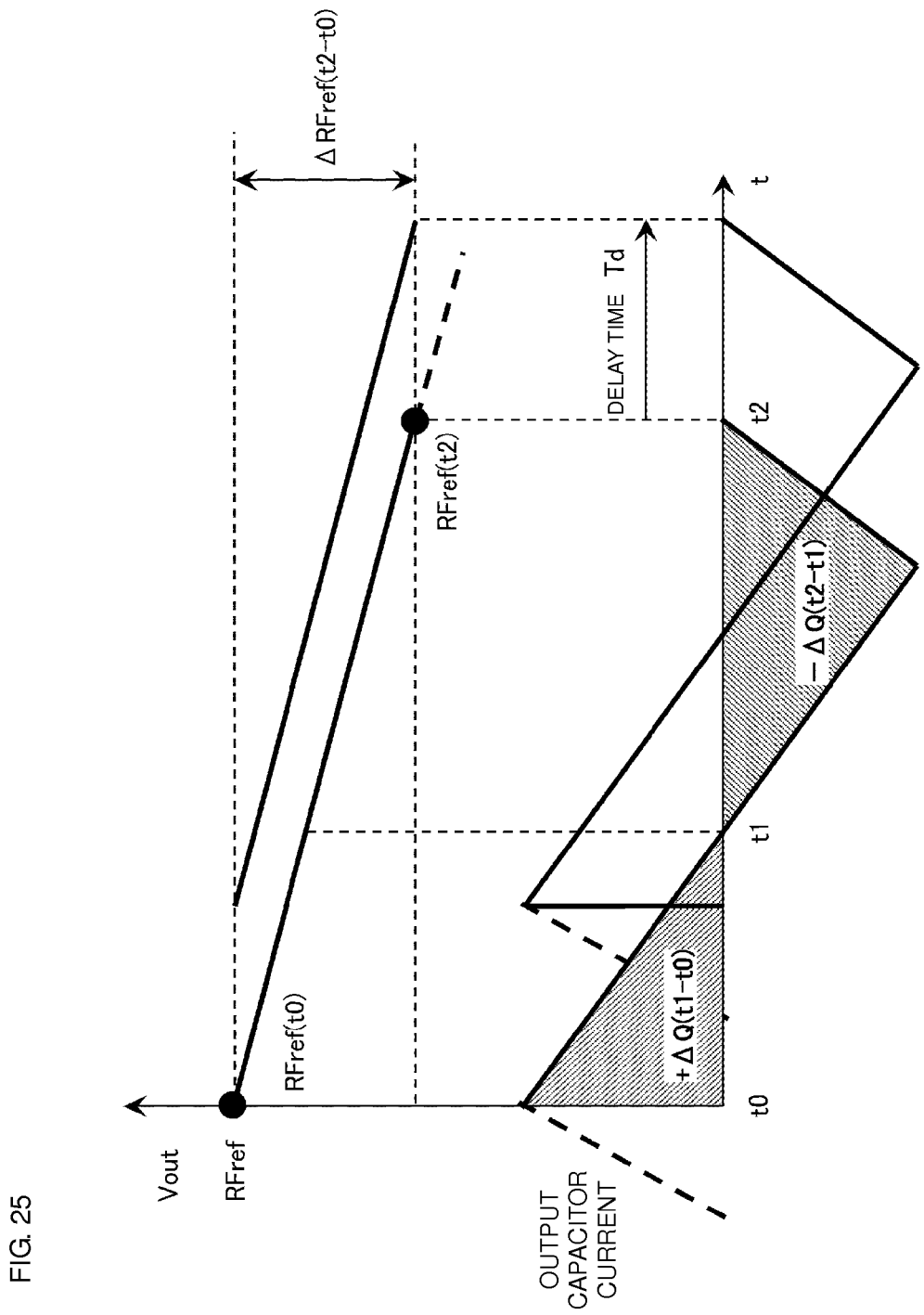
FIG. 25 is a diagram illustrating supply/regeneration control on an output capacitor of a power supply device for a high frequency power amplification circuit according to a fifteenth preferred embodiment of the present invention and illustrates an example in which a supply period and a regeneration period in bidirectional converters are distinct from each other (1 phase).
Figure 26:
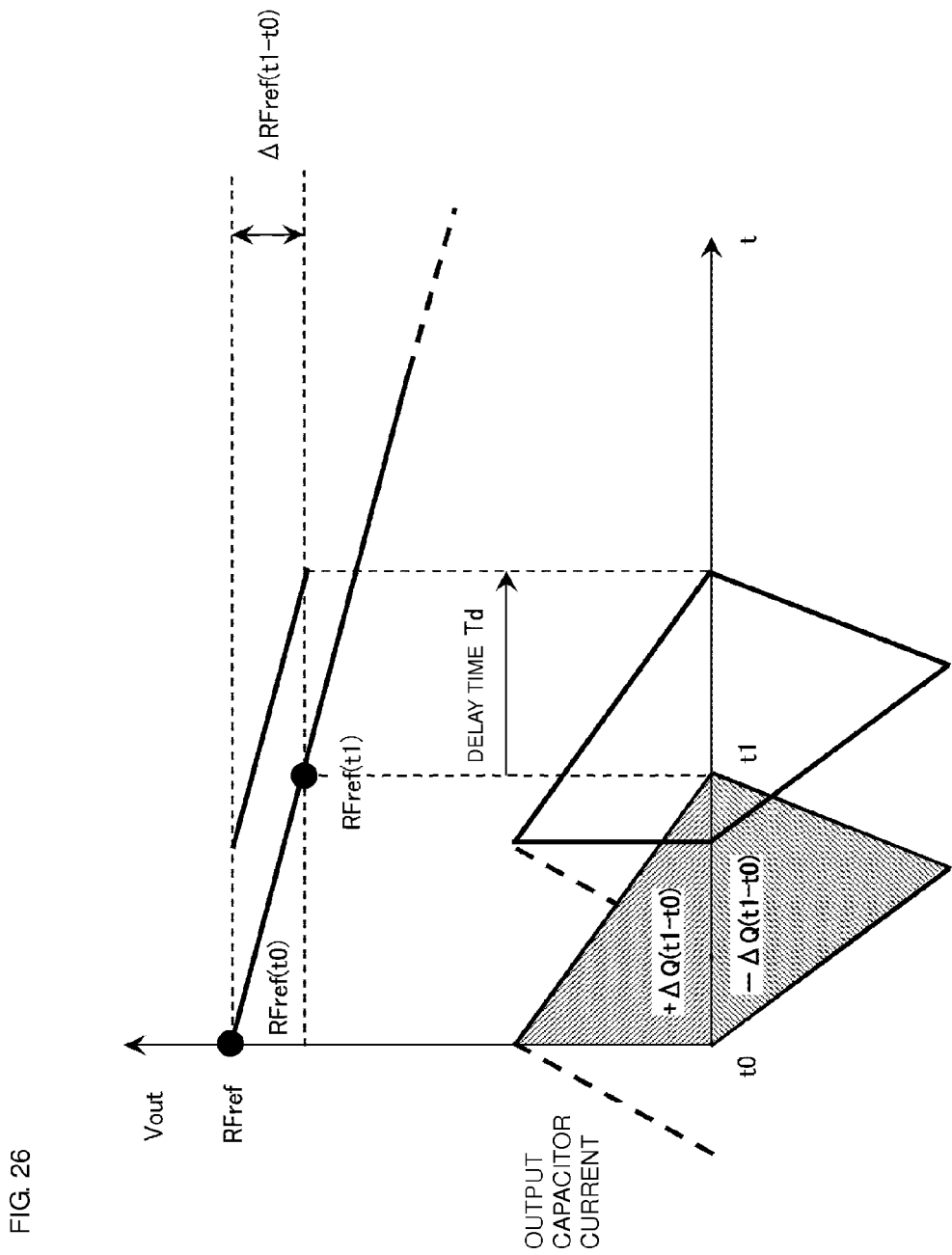
FIG. 26 is a diagram illustrating supply/regeneration control on the output capacitor of the power supply device for a high frequency power amplification circuit according to the fifteenth preferred embodiment of the present invention and illustrates an example in which supply and regeneration in bidirectional converters are carried out simultaneously (2 phases).

FIGS. 25 and 26 are diagrams each illustrating supply/regeneration control on an output capacitor in a power supply device for a high frequency power amplification circuit according to a fifteenth preferred embodiment of the present invention.

FIG. 25 illustrates an example in which the supply period and the regeneration period in the bidirectional converters are distinct from each other (1 phase). Here, the control is carried out so as to satisfy the expression below, in which $\Delta RFref(t2-t0)$ indicates an amplitude change of an input signal per unit time (period from t0 to t2), Gain indicates a required gain, $+\Delta Q(t1-t0)$ indicates an amount of electric charge to be supplied, $-\Delta Q(t2-t1)$ indicates an amount of electric charge to be regenerated, and Cout indicates the capacitance of the output capacitor.

$$\Delta Vout = \Delta RFref(t2-t0) \times Gain = \{+\Delta Q(t1-t0) - \Delta Q(t2-t1)\}/Cout$$

The mountain-shaped configuration in FIG. 25 indicates the current that flows in the output capacitor, and the area thereof indicates the amount of transferred electric charge in the output capacitor. In this example, the operation as a total is a regeneration operation, and $\Delta Vout$ is negative.

Such timing control makes it possible to obtain an output voltage having high following performance to the input signal.

FIG. 26 illustrates an example in which the supply and regeneration in the bidirectional converters are carried out simultaneously (2 phases). Here, the control is carried out so as to satisfy the expression below, in which $\Delta RFref(t1-t0)$ indicates an amplitude change of an input signal per unit time (period from t0 to t1), Gain indicates a required gain, +ΔQ (t1−t0) indicates an amount of electric charge to be supplied, −ΔQ(t1−t0) indicates an amount of electric charge to be regenerated, and Cout indicates the capacitance of the output capacitor.

$$\Delta Vout = \Delta RFref(t1-t0) \times Gain = \{+\Delta Q(t1-t0) - \Delta Q(t1-t0)\}/Cout$$

The mountain-shaped configuration in FIG. 26 indicates the current that flows in the output capacitor, and the area thereof indicates the amount of transferred electric charge in the output capacitor. In this example, the operation as a total is a regeneration operation, and ΔVout is negative.

If the supply and regeneration are carried out in multiple phases such as two phases or more in this manner, an output voltage having high following performance to the input signal can be obtained.

Sixteenth Preferred Embodiment

Figure 27:
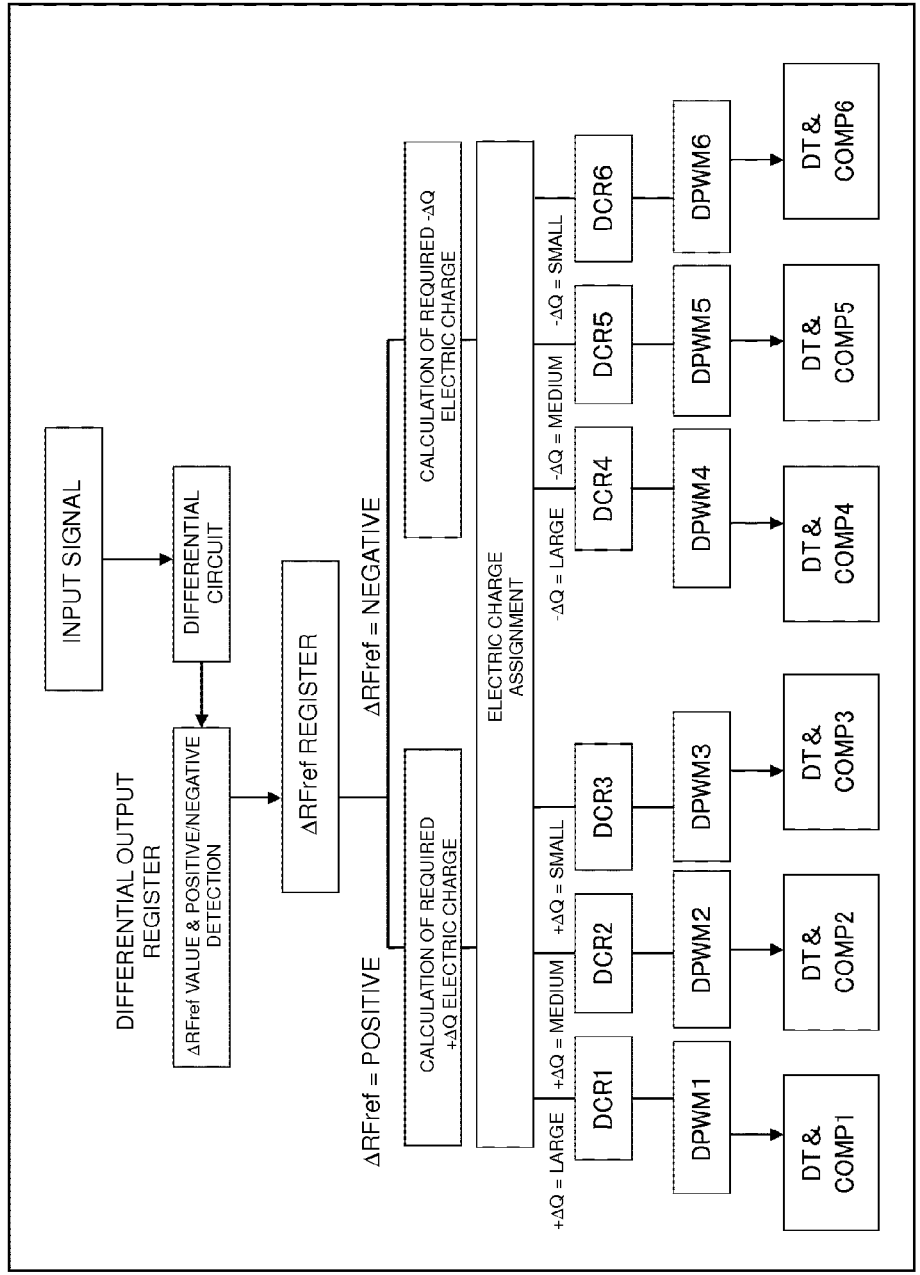
FIG. 27 is a diagram illustrating content of processing in which an amplitude change monitor circuit in a power supply device for a high frequency power amplification circuit according to a sixteenth preferred embodiment of the present invention follows an input signal to carry out PWM control on a switching device of a bidirectional converter.

FIG. 27 is a diagram illustrating content of processing for carrying out PWM control on a switching device in a bidirectional converter by an amplitude change monitor circuit following an input signal in a power supply device for a high frequency power amplification circuit according to a sixteenth preferred embodiment of the present invention.

First, the input signal is differentiated to detect ΔRFref value and its sign, and the ΔRFref value is inputted to a ΔRFref register. If the ΔRFref value is positive, a required+ΔQ electric charge is calculated, and if the ΔRFref value is negative, a required −ΔQ electric charge is calculated. Each converter is then assigned either to supply or to regenerate electric charges in accordance with this value of ±ΔQ. In other words, the value of +ΔQ is classified into three, namely, "+ΔQ=large," "+ΔQ=medium," and "+ΔQ=small," which are then inputted to duty cycle registers DCR1, DCR2, and DCR3, respectively. In addition, as for −ΔQ as well, the value of −ΔQ is classified into three, namely, "−ΔQ=large," "−ΔQ=medium," and "−ΔQ=small," which are then inputted to duty cycle registers DCR4, DCR5, and DCR6, respectively.

Digital PWM circuits DPWM1 to DPWM6 output on-duty ratio signals in accordance with the values in the duty cycle registers DCR1 to DCR6. Dead time equipped complementary output generators DT&COMP1 to DT&COMP6 drive the rectifying switching devices and the commutation switching devices of the bidirectional converters in accordance with the output signals of the digital PWM circuits DPWM1 to DPWM6.

Figure 28:
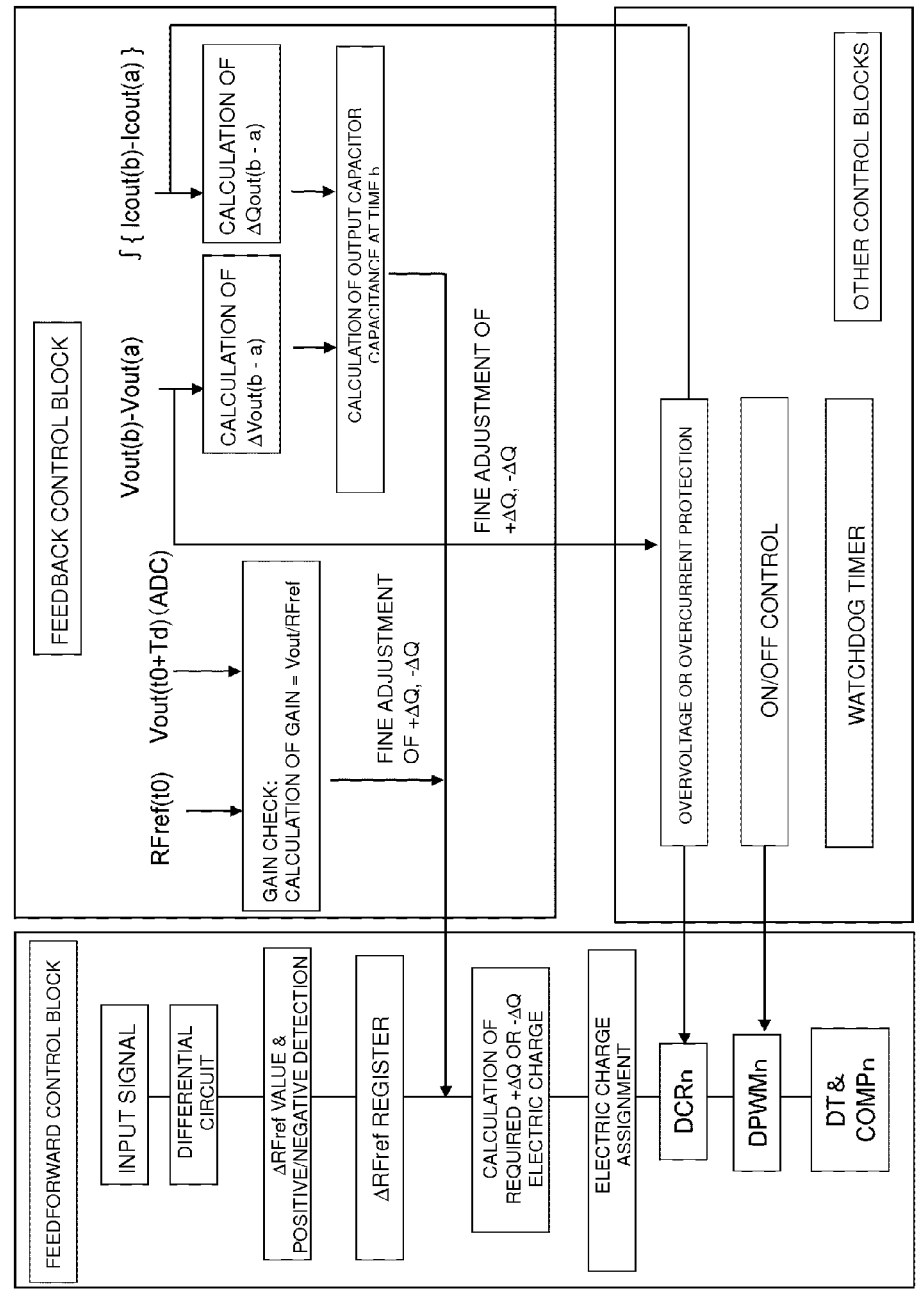
FIG. 28 is a diagram illustrating processing content of feedback control and other control blocks.

FIG. 28 is a diagram illustrating processing content of feedback control including processing content of other control blocks. A "feedforward control block" in FIG. 28 is illustrated as a simplified version of the configuration illustrated in FIG. 27. In FIG. 28, in the "feedback control block," a gain Vout/RFref is obtained on the basis of the amplitude change ΔRFref(t0) of the input signal at the time t0 and the output voltage Vout(t0+Td) after the delay time Td. Then, +ΔQ and −ΔQ for making a fine adjustment to a deviation of the gain Vout/RFref relative to a designed gain Gain are obtained accordingly. Thus, a value required in the "calculation of required+ΔQ or −ΔQ electric charges" in the feedforward control block is adjusted finely.

Furthermore, in the "feedback control block," a difference ΔVout(b−a) between Vout(a) at a previous timing and Vout(b) at a current timing is calculated, and a time-integrated value ΔQout(b−a) of a difference between a current Icout(a) that has flowed in the output capacitor at the previous timing and Icout(b) at the current timing is calculated. Then, the capacitance of the output capacitor at the time b is calculated, and +ΔQ and −ΔQ to make a fine adjustment to a deviation in the capacitance relative to the designed capacitance are obtained. Thus, a value used in the "calculation of required+ΔQ or −ΔQ electric charges" in the feedforward control block is adjusted.

In the "other control block," the on-duty ratio of the duty cycle register DCRn is regulated when Vout exceeds a predetermined upper limit value or when Icout exceeds a predetermined upper limit value. Through this, overvoltage protection or overcurrent protection is carried out. Further, the digital PWM circuit DPWMn is forcibly turned OFF (on-duty 0) in response to an externally supplied forced ON/OFF signal. In addition, if a watchdog timer expires, an alarm is outputted to the outside.

Figure 29:
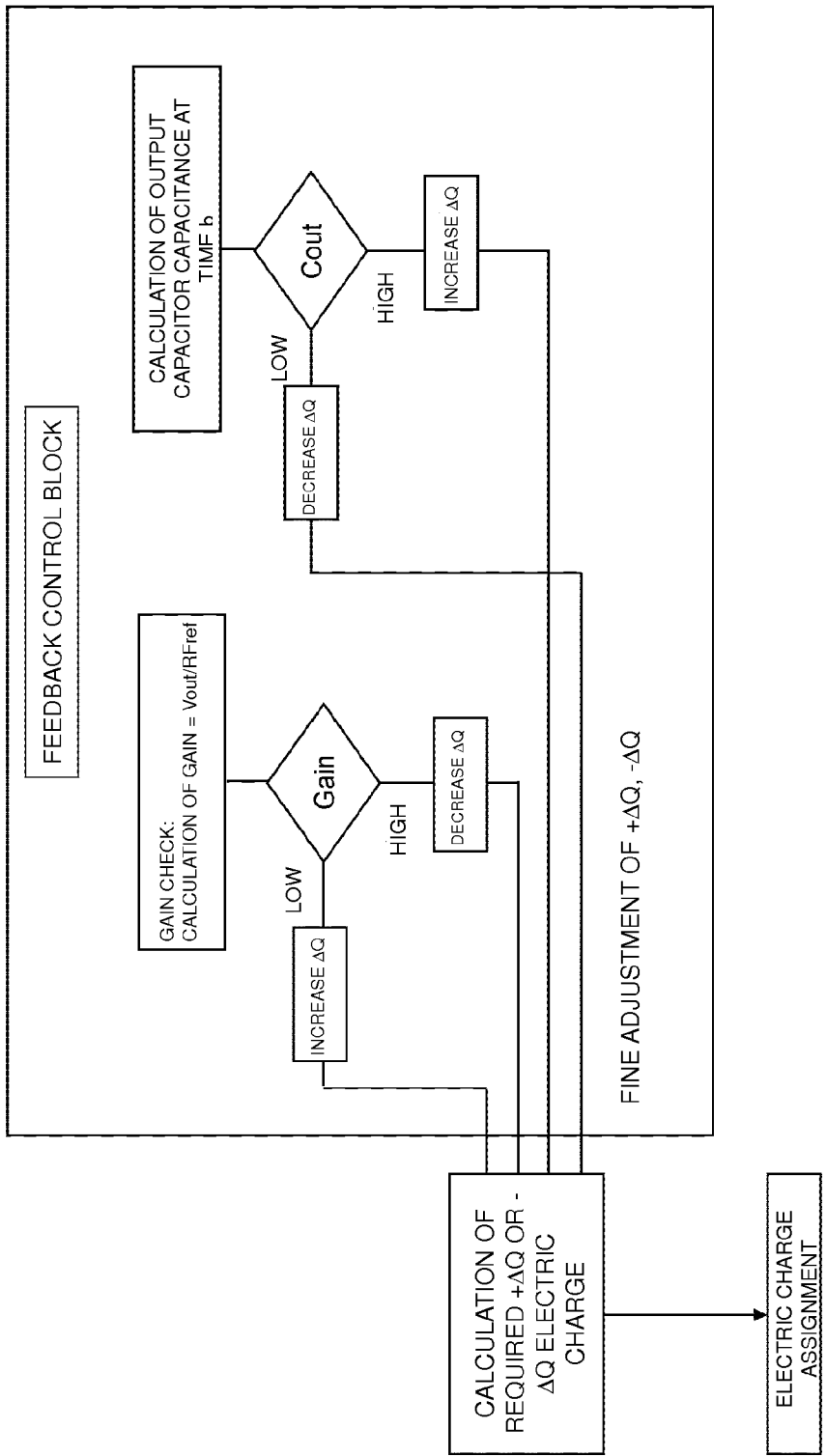
FIG. 29 is a diagram illustrating content of processing to calculate a required $+\Delta Q$ or $-\Delta Q$ including a fine adjustment by the feedback control block.

FIG. 29 is a diagram illustrating content of processing for calculating a required+ΔQ or −ΔQ including the fine adjustment by the feedback control block. When the actual gain is less than the designed gain Gain, the electric charge is increased by ΔQ, and when the actual gain is greater than the designed gain Gain, the electric charge is decreased by ΔQ. Furthermore, when the capacitance Cout of the output capacitor at the time b is less than a designed value, the electric charge is decreased by ΔQ, and when the capacitance Cout is greater than the designed value, the electric charge is increased by ΔQ.

Figure 30:
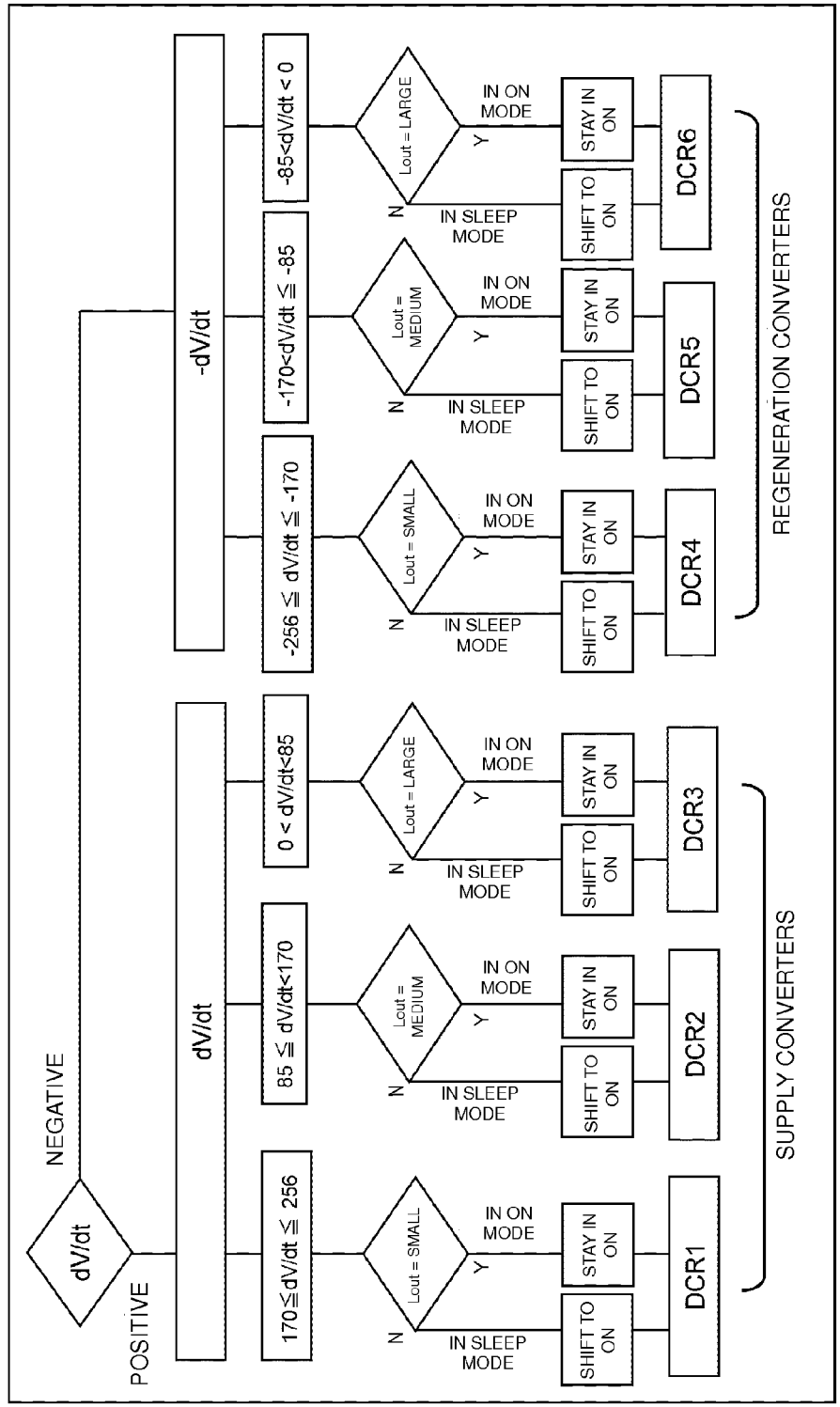
FIG. 30 is a diagram illustrating an example of electric charge assignment processing.

FIG. 30 is a diagram illustrating an example of electric charge assignment processing. In this processing, a variation (max−min) of dV/dt of the actual envelope is divided by the number of phases, and the value of the duty cycle register DCR for a corresponding converter is determined in accordance with the range of values of dV/dt.

If dV/dt is equal to or greater than 170 but equal to or less than 256, the value of the duty cycle register DCR1 for the converter CONV1 is determined so that the converter CONV1, in which Lout is small and the supply amount is large, stays in an ON mode, that is, if a previous state is an ON mode, the converter CONV1 stays in the ON mode, or if the previous state is a SLEEP mode, the converter CONV1 cancels the SLEEP mode to shift to the ON mode.

If dV/dt is equal to or greater than 85 but less than 170, the value of the duty cycle register DCR2 for the converter CONV2 is determined so that the converter CONV2, in which Lout is medium and the supply amount is medium, stays in an ON mode, that is, if a previous state is an ON mode, the converter CONV2 stays in the ON mode, or if the previous state is a SLEEP mode, the converter CONV2 cancels the SLEEP mode to shift to the ON mode.

Similarly, if dV/dt is greater than 0 but less than 85, the value of the duty cycle register DCR3 for the converter CONV3 is determined so that the converter CONV3, in which Lout is large and the supply amount is small, stays in an ON mode, that is, if a previous state is an ON mode, the converter CONV3 stays in the ON mode, or if the previous state is a SLEEP mode, the converter CONV3 cancels the SLEEP mode to shift to the ON mode.

If dV/dt is equal to or greater than −256 but equal to or less than −170, the value of the duty cycle register DCR4 for the converter CONV4 is determined so that the converter CONV4, in which Lout is small and the regeneration amount is large, stays in an ON mode, that is, if a previous state is an ON mode, the converter CONV4 stays in the ON mode, or if the previous state is a SLEEP mode, the converter CONV4 cancels the SLEEP mode to shift to the ON mode.

If dV/dt is greater than −170 but equal to or less than −85, the value of the duty cycle register DCR5 for the converter CONV5 is determined so that the converter CONV5, in which Lout is medium and the regeneration amount is medium, stays in an ON mode, that is, if a previous state is an ON mode, the converter CONV5 stays in the ON mode, or if the previous state is a SLEEP mode, the converter CONV5 cancels the SLEEP mode to shift to the ON mode.

Similarly, if dV/dt is greater than −85 but less than 0, the value of the duty cycle register DCR6 for the converter CONV6 is determined so that the converter CONV6, in which Lout is large and the regeneration amount is small, stays in an ON mode, that is, if a previous state is an ON mode, the converter CONV6 stays in the ON mode, or if the previous state is a SLEEP mode, the converter CONV6 cancels the SLEEP mode to shift to the ON mode.

Seventeenth Preferred Embodiment

Figure 31A:
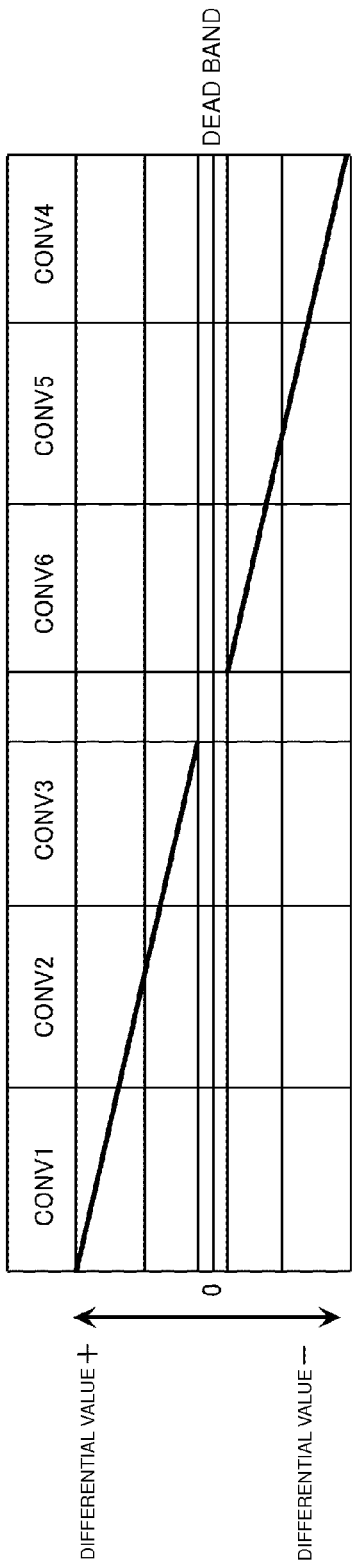
FIGS. 31A and 31B are diagrams illustrating an example in which a dead band is provided in accordance with a differential value dV/dt of an envelope of an input signal.
Figure 31B:
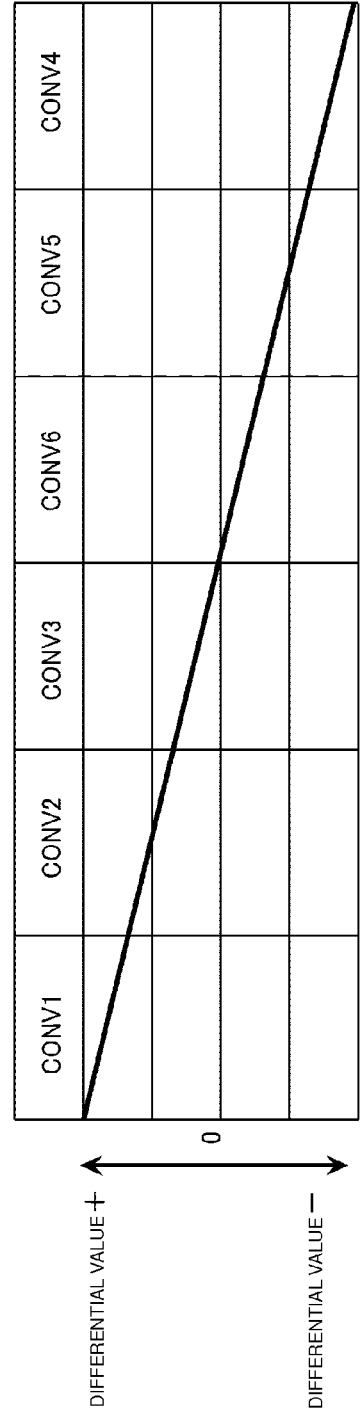

FIGS. 31A and 31B are diagrams illustrating an example in which a dead band is provided in accordance with a differential value dV/dt of an input signal. If the differential value dV/dt is positive and large, the supply converter CONV1 having a large supply amount is used. If dV/dt is positive and medium, the supply converter CONV2 having a medium supply amount is used. If dV/dt is positive and small, the supply converter CONV3 having a small supply amount is used. Furthermore, if dV/dt is negative and large, the regeneration converter CONV4 having a large regeneration amount is used. If dV/dt is negative and medium, the regeneration converter CONV5 having a medium regeneration amount is used. If dV/dt is negative and small, the regeneration converter CONV6 having a small regeneration amount is used.

As in the example illustrated in FIG. 31B, when an absolute value of the differential value dV/dt continues to vary within a small range, the supply operation of the converter CONV3 and the regeneration operation of the converter CONV6 frequently switch to and from each other. On the other hand, as illustrated in in FIG. 31A, when the absolute value of the differential value dV/dt is small and falls within the dead band, all of the converters CONV1 to CONV6 stop. Through this, a phenomenon where the supply operation of the converter CONV3 and the regeneration operation of the converter CONV6 switch frequently to and from each other is prevented, and concentration of the processing on the duty cycle registers DCR3 and DCR6 is alleviated, stabilizing the operation.

Eighteenth Preferred Embodiment

Figure 32A:
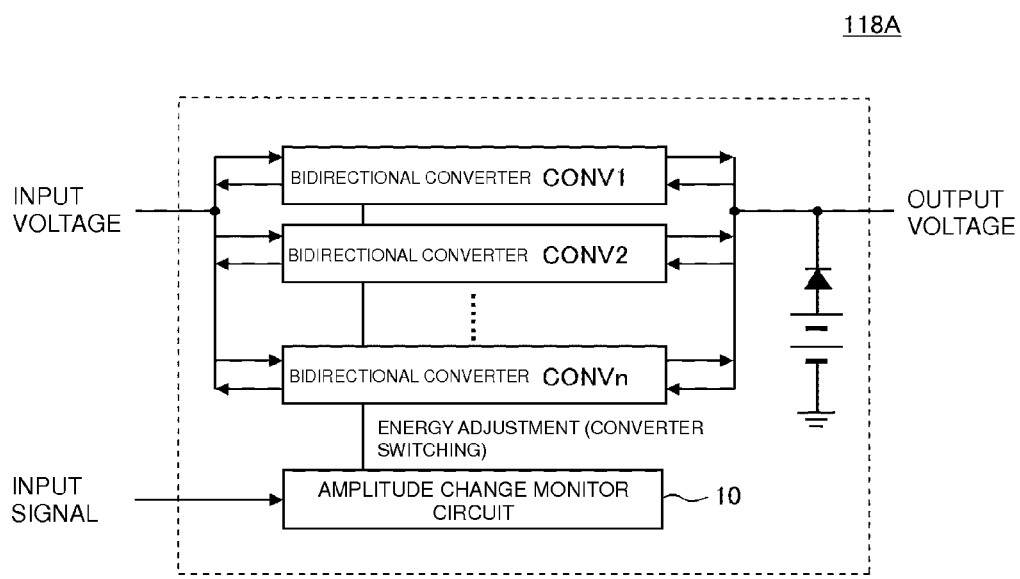
FIG. 32A is a block diagram illustrating a configuration of a power supply device 118A for a high frequency power amplification circuit according to an eighteenth preferred embodiment of the present invention.
Figure 32B:
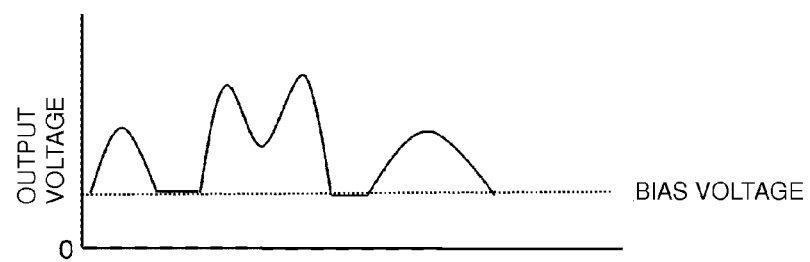
FIG. 32B is a waveform diagram of an output voltage of the power supply device 118A for a high frequency power amplification circuit.

FIG. 32A is a block diagram illustrating the configuration of a power supply device 118A for a high frequency power amplification circuit of an eighteenth preferred embodiment. FIG. 32B is a waveform diagram of the output voltage.

As illustrated in FIG. 32A, this power supply device 118A for a high frequency power amplification circuit includes a bias voltage superposition circuit provided at an output section of the bidirectional converters CONV1 to CONVn. This bias voltage superposition circuit is a circuit that generates a direct current bias voltage and superposes the direct current bias voltage onto an output of the plurality of bidirectional converters CONV1 to CONVn. This circuit that generates the direct current bias voltage is constituted by a single or a plurality of bidirectional converters. Alternatively, the direct current bias voltage is supplied from the voltage stabilization circuit provided at a stage prior to the input section for the input voltage.

As illustrated in FIG. 32B, the output voltage takes a value that constantly exceeds the direct current bias voltage and follows the envelope of the input signal within the range exceeding this bias voltage. Through this configuration, the range in which the output voltage varies is reduced, and the control range is limited, improving the control performance.

Figure 33A:
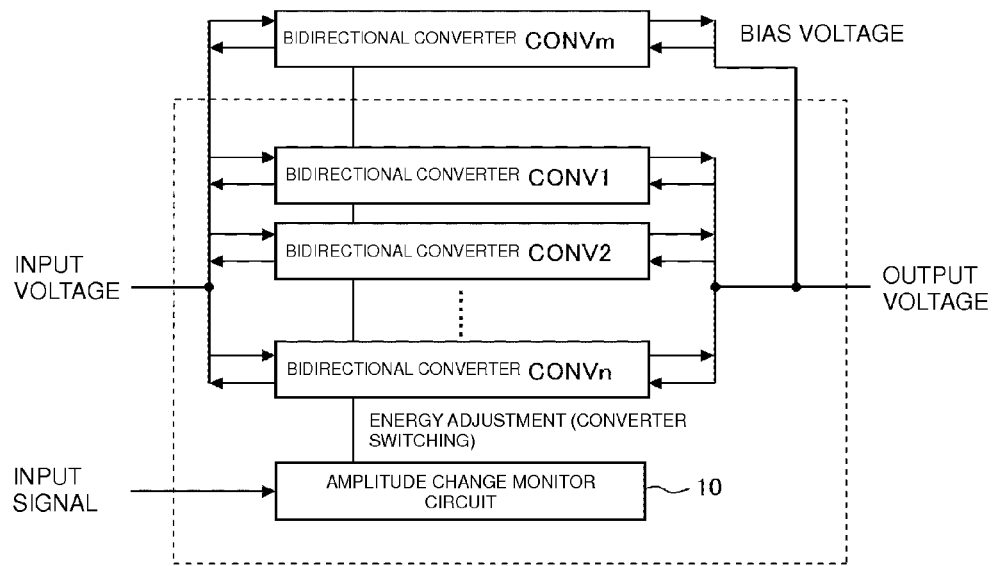
FIG. 33A is a block diagram illustrating a configuration of a power supply device 118B for a high frequency power amplification circuit according to the eighteenth preferred embodiment of the present invention.
Figure 33B:
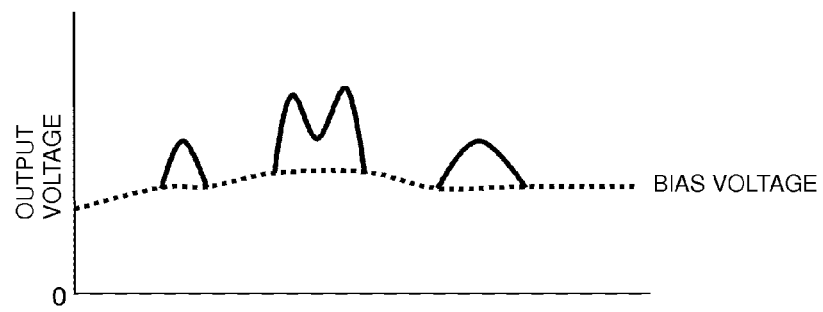
FIG. 33B is a waveform diagram of an output voltage of the power supply device 118B for a high frequency power amplification circuit.

FIG. 33A is a block diagram illustrating the configuration of a power supply device 118B for a high frequency power amplification circuit of the eighteenth preferred embodiment. This power supply device 118B for a high frequency power amplification circuit is a more detailed example of the power supply device for a high frequency power amplification circuit illustrated in FIG. 32A. FIG. 33B is a waveform diagram of an output voltage of the power supply device 118B for a high frequency power amplification circuit. In FIG. 33A, a bidirectional converter CONVm is a bidirectional converter provided at a stage prior to the input section for the input voltage and supplies a direct current bias voltage.

If the high frequency power amplification circuit (load to which the output voltage is supplied) has a variable resistance property within an range that does not exceed the direct current bias voltage, the operation mode of the bidirectional converter CONVm, which generates the direct current bias voltage, is preferably an operation mode in which its choke coil current flows continuously so that the output voltage is determined uniquely on the basis of the input voltage and the time ratio. Through this, feedforward control performance is improved. Furthermore, this direct current bias voltage can also be varied as necessary.

Nineteenth Preferred Embodiment

Figure 34:
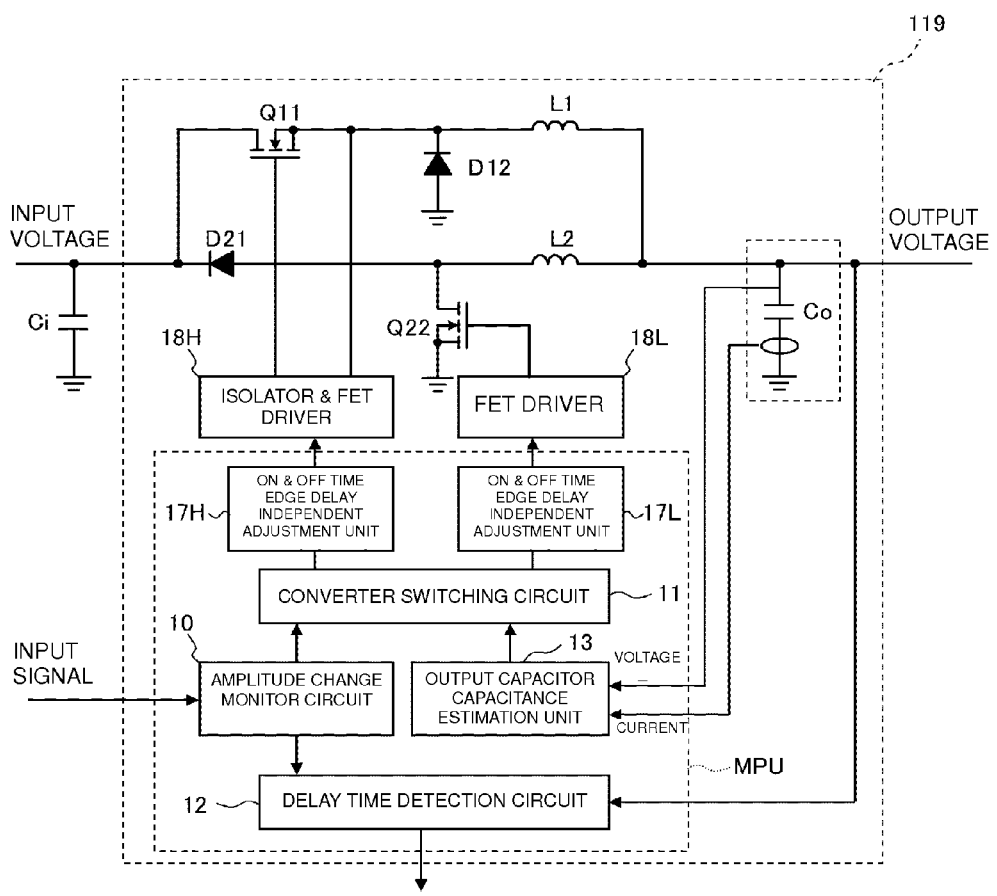
FIG. 34 is a block diagram illustrating a configuration of a power supply device 119 for a high frequency power amplification circuit according to a nineteenth preferred embodiment of the present invention.

FIG. 34 is a block diagram illustrating the configuration of a power supply device 119 for a high frequency power amplification circuit according to a nineteenth preferred embodiment of the present invention.

A pulse signal outputted from the converter switching circuit 11 is affected by a later-stage device delay, and thus ON and OFF time edge delay independent adjustment units 17H and 17L are provided for the high side switching device and the low side switching device, respectively. The ON and OFF time edge delay independent adjustment units 17H and 17L independently adjust a delay time of a rising edge at the time of being turned on and a delay time of a falling edge at the time of being turned off. An FET driver 18L drives the low side switching device Q22 through an output signal of the ON and OFF time edge delay independent adjustment unit 17L. An isolator and FET driver 18H drives the high side switching device Q11 through an output signal of the ON and OFF time edge delay independent adjustment unit 17H. These delay adjustment units 18H and 18L are constituted by shift registers or the like.

In this manner, the delay adjustment units are provided in the computation microprocessor MPU, and timing-adjusted pulse signals are supplied to each converter in accordance with a variation in the actual device delay.

Although a delay time in calculating digital data processed in the computation microprocessor MPU can be anticipated, a variation in the delay time in propagating ON and OFF of primarily a power semiconductor such as a pulse transformer, a digital isolator, a photocoupler, an FET driver, a switching device (FET, etc.) that receives the pulse signal outputted from the converter switching circuit 11 is relatively very large. Although the variation in the actual device is a problem, by individually adjusting the delay in turning on or turning off the device in accordance with these variations, adjustment can be made individually in manufacturing processes, for example. Thus, ON/OFF of the power semiconductor can be controlled with precision with the data that has undergone calculation processing.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply device for a high frequency power amplification circuit, the power supply device being configured to vary an output voltage supplied as a power supply voltage to the high frequency power amplification circuit that amplifies a high frequency signal, in accordance with an amplitude change of the high frequency signal, the power supply device comprising:
　at least one bidirectional converter provided between an input section for an input voltage and an output section for an output voltage, the least one bidirectional converter being capable of supplying or regenerating an electric charge;
　an amplitude change monitor circuit configured to detect the amplitude change of the high frequency signal and to control the at least one bidirectional converter supplying or regenerating an electric charge so that the output voltage follows the amplitude change of the high frequency signal;
　an output side energy storage device provided at an output section of the at least one bidirectional converter; and
　a regeneration energy storage device provided at an input section of the at least one bidirectional converter, the regeneration energy storage device being configured to store regenerated energy from the output side energy storage device.

2. A power supply device for a high frequency power amplification circuit, the power supply device being configured to vary an output voltage supplied as a power supply voltage to the high frequency power amplification circuit that amplifies a high frequency signal, in accordance with an amplitude change of the high frequency signal, the power supply device comprising:
　at least one bidirectional converter provided between an input section for an input voltage and an output section for an output voltage, the least one bidirectional converter being capable of supplying or regenerating an electric charge; and
　an amplitude change monitor circuit configured to detect the amplitude change of the high frequency signal and to control the at least one bidirectional converter supplying or regenerating an electric charge so that the output voltage follows the amplitude change of the high frequency signal; wherein
　the at least one bidirectional converter is provided in a plurality; and
　the amplitude change monitor circuit includes a switching circuit configured to switch between supply and regeneration performed by the plurality of bidirectional converters on the basis of the amplitude change of the high frequency signal.

3. The power supply device for the high frequency power amplification circuit according to claim 2, wherein the plurality of bidirectional converters each differ in an amount of energy supplied or regenerated.

4. The power supply device for the high frequency power amplification circuit according to claim 3, wherein the amount of energy supplied or regenerated differs in accordance with inductance of a choke coil or an inductance component that is parasitic in the circuit.

5. The power supply device for the high frequency power amplification circuit according to claim 1, wherein
　the bidirectional converter includes a switching device and a switching control circuit configured to control an amount of energy to be supplied or regenerated by controlling an on time or an off time of the switching device; and
　the switching control circuit carries out control in which any of a time ratio, a switching frequency, a sleep time, and a burst time of the switching device are combined.

6. A power supply device for a high frequency power amplification circuit, the power supply device being configured to vary an output voltage supplied as a power supply voltage to the high frequency power amplification circuit that amplifies a high frequency signal, in accordance with an amplitude change of the high frequency signal, the power supply device comprising:
　at least one bidirectional converter provided between an input section for an input voltage and an output section for an output voltage, the least one bidirectional converter being capable of supplying or regenerating an electric charge;
　an amplitude change monitor circuit configured to detect the amplitude change of the high frequency signal and to control the at least one bidirectional converter supplying or regenerating an electric charge so that the output voltage follows the amplitude change of the high frequency signal; and
　a delay time detection circuit configured to grasp a delay time of a change in the output voltage relative to the amplitude change of the high frequency signal.

7. The power supply device for the high frequency power amplification circuit according to claim 1, wherein the amplitude change monitor circuit includes a supply/regeneration electric charge amount adjustment unit configured to adjust an amount of electric charge to be supplied to the output side energy storage device or regenerated based on a capacitance value of the output side energy storage device and the amplitude change of the high frequency signal.

8. The power supply device for the high frequency power amplification circuit according to claim 7, wherein
　the amplitude change monitor circuit includes a unit configured to obtain a differential value of the amplitude of the high frequency signal; and
　the supply/regeneration electric charge amount adjustment unit increases the amount of electric charge to be supplied to the output side energy storage device or to be regenerated from the output side energy storage device, as a slope of the amplitude change of the high frequency signal increases.

9. The power supply device for the high frequency power amplification circuit according to claim 1, wherein the amplitude change monitor circuit includes an output capacitance estimation unit configured to detect an applied voltage and a current to the output side energy storage device to estimate a capacitance of the output side energy storage device.

10. The power supply device for the high frequency power amplification circuit according to claim 9, wherein the output capacitance estimation unit is a calculation unit configured to detect an amount of transferred electric charge based on a current that flows to the output side energy storage device and to set, as the capacitance of the output side energy storage device, a value obtained by dividing the amount of transferred electric charge by an amount of change in an applied voltage to the output side energy storage device.

11. The power supply device for the high frequency power amplification circuit according to claim 9, wherein the output capacitance estimation unit samples an applied voltage and a current applied to the output side energy storage device, converts a sampling result into a digital signal, and estimates a capacitance of the output side energy storage device through digital calculation based on data at a plurality of points.

12. The power supply device for the high frequency power amplification circuit according to claim 2, wherein the amplitude change monitor circuit includes a microprocessor including:
a switch that switches between operating and stopping the at least one bidirectional converter;
a detector that detects a malfunction of the at least one bidirectional converter; and
a stopper that stops operation of the at least one bidirectional converter when a malfunction is detected.

13. The power supply device for the high frequency power amplification circuit according to claim 2, wherein the amplitude change monitor circuit carries out control so as to satisfy $\Delta V_{out}=\Delta RFref(t1-t0) \times Gain = [+\Delta Q(t1-t0) - \Delta Q(t1-t0)]/C_{out}$, where $\Delta RFref(t1-t0)$ indicates the amplitude change of the high frequency signal per unit time (period from t0 to t1), Gain indicates a required gain, $+\Delta Q(t1-t0)$ indicates an amount of supplied electric charge, $-\Delta Q(t1-t0)$ indicates an amount of regenerated electric charge, Cout indicates a capacitance of the output side energy storage device, and $\Delta V_{out}$ indicates a change in the output voltage.

14. The power supply device for the high frequency power amplification circuit according to claim 2, wherein
the amplitude change monitor circuit includes a microprocessor; and
the microprocessor is programmed to discretely turn ON/OFF the at least one bidirectional converter to control supply and regeneration of electric charges by the at least one bidirectional converter.

15. The power supply device for the high frequency power amplification circuit according to claim 14, wherein the amplitude change monitor circuit includes a pulse generator that assigns an amount of electric charge to be supplied or regenerated by each of the plurality of bidirectional converters based on the amount of electric charge to be supplied and regenerated which is obtained through a differential value of the amplitude of the high frequency signal and controls ON/OFF of each bidirectional converter.

16. The power supply device for the high frequency power amplification circuit according to claim 15, wherein the pulse generator includes a delay device that independently adjusts a delay time at a time of turning on each of the at least one bidirectional converter and a delay time at a time of turning off each of the at least one bidirectional converter.

17. The power supply device for the high frequency power amplification circuit according to claim 14, wherein the amplitude change monitor circuit includes a controller programmed to carry out dead band control to stop the discrete ON/OFF control of the at least one bidirectional converter if the differential value of the amplitude of the high frequency signal is less than a threshold value.

18. The power supply device for the high frequency power amplification circuit according to claim 1, further comprising a direct current bias voltage superposition unit configured to superpose a direct current bias voltage in the output section.

19. The power supply device for the high frequency power amplification circuit according to claim 18, wherein the direct current bias voltage superposition unit includes a bidirectional converter and a control circuit that modifies the direct current bias voltage generated by the bidirectional converter of the direct current bias voltage superposition unit on a time axis.

20. The power supply device for the high frequency power amplification circuit according to claim 1, further comprising a delay time detection circuit configured to grasp a delay time of a change in the output voltage relative to the amplitude change of the high frequency signal.

21. The power supply device for the high frequency power amplification circuit according to claim 2, further comprising a delay time detection circuit configured to grasp a delay time of a change in the output voltage relative to the amplitude change of the high frequency signal.

* * * * *